United States Patent [19]
Ozaki

[11] Patent Number: 5,780,332
[45] Date of Patent: Jul. 14, 1998

[54] METHOD OF MANUFACTURING A SEMICONDUCTOR MEMORY DEVICE WITH A TRENCH CAPACITOR

[75] Inventor: Tohru Ozaki, Tokyo, Japan

[73] Assignee: Kabushiki Kaisha Toshiba, Kawasaki, Japan

[21] Appl. No.: 812,973

[22] Filed: Mar. 5, 1997

[30] Foreign Application Priority Data

Mar. 11, 1996 [JP] Japan ................................ 8-053218

[51] Int. Cl.$^6$ ............................................ H01L 21/8242
[52] U.S. Cl. ....................... 438/238; 438/243; 438/386
[58] Field of Search ............................. 438/238, 239, 438/243, 244, 248, 381, 386, 387, 391; 257/301, 302, 303, 305

[56] References Cited

U.S. PATENT DOCUMENTS

| 5,250,458 | 10/1993 | Tsukamoto et al. | 438/244 |
| 5,360,758 | 11/1994 | Bronner et al | 438/386 |
| 5,618,745 | 4/1997 | Kita | 438/243 |

FOREIGN PATENT DOCUMENTS

| 60-148165 | 8/1985 | Japan . |
| 63-86560 | 4/1988 | Japan . |
| 63-107164 | 5/1988 | Japan . |

*Primary Examiner*—Joni Chang
*Attorney, Agent, or Firm*—Oblon, Spivak, McClelland, Maier & Neustadt, P.C.

[57] ABSTRACT

A semiconductor memory device includes a semiconductor substrate, an element isolation film formed on the substrate, element formation regions each defined in an island form in the surface of the substrate by the element isolation film, trenches formed in the element formation regions, respectively, capacitors each formed in a corresponding one of the trenches, each having a plate electrode formed of the substrate, a capacitor insulating film formed on the inner wall of the trench and a storage electrode filled in the trench with the capacitor insulating film disposed therebetween, transistors each formed in the element formation regions, and having a gate electrode which is formed to extend over the substrate and pass over the trench and the element formation region, a first impurity diffusion layer formed on one side of the gate electrode, a second impurity diffusion layer formed on the other side of the gate electrode, and channel regions formed on the element formation region on both sides of the trench below the gate electrode and respectively connected to the first and second impurity diffusion layers, connection electrodes for respectively connecting the storage electrodes to the first impurity diffusion layers, and signal transmission lines respectively connected to the second impurity diffusion layers.

10 Claims, 29 Drawing Sheets

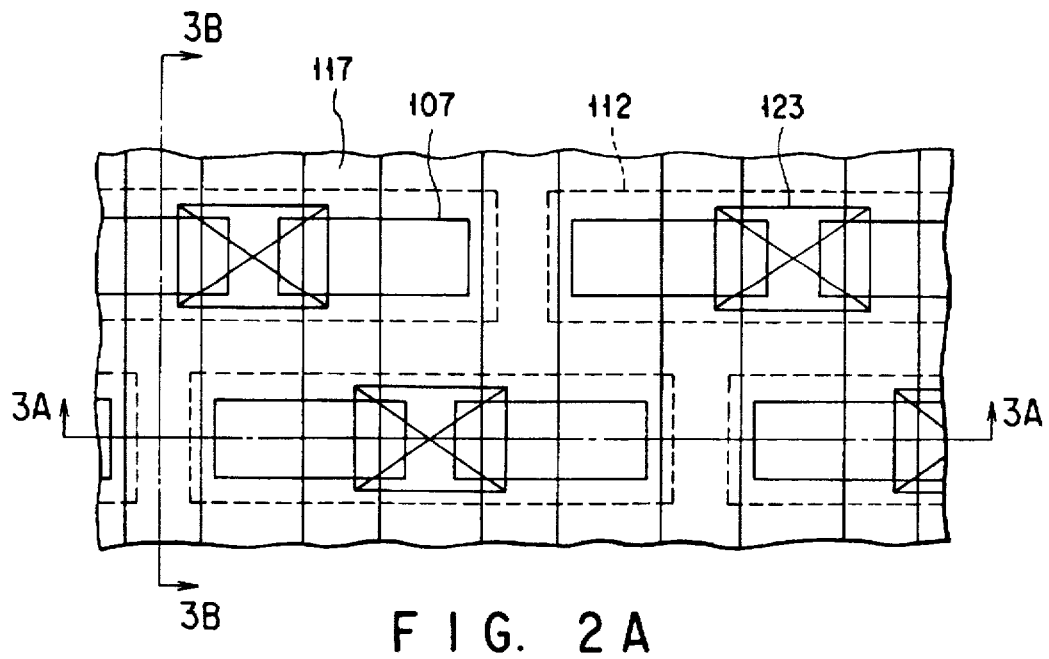
F I G. 2A
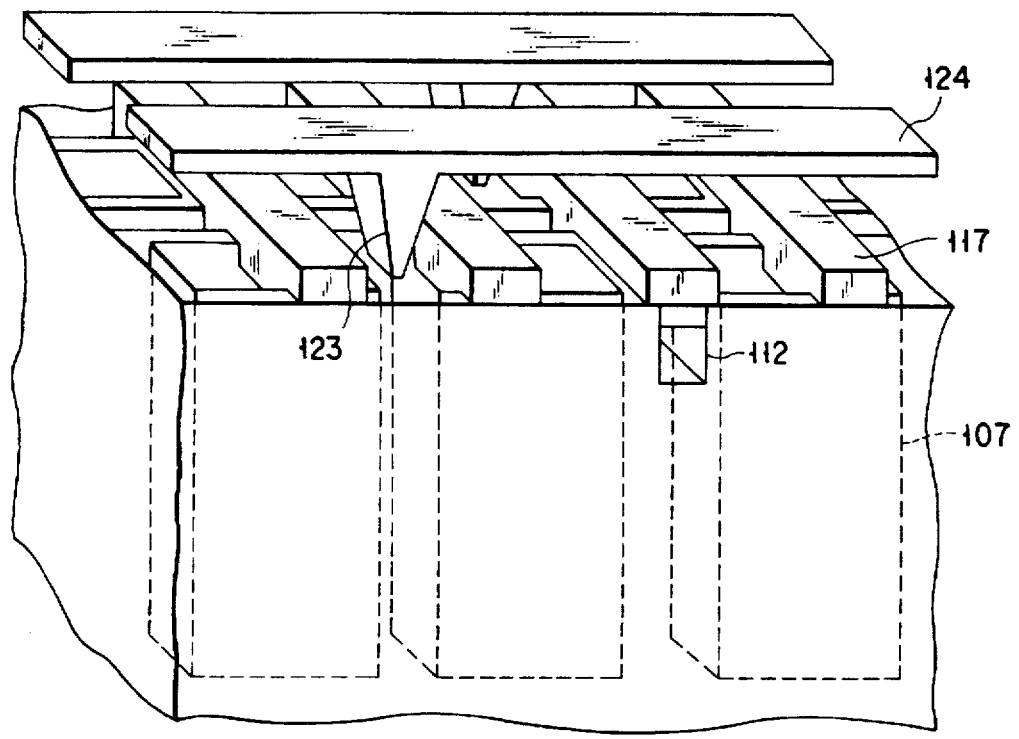
F I G. 2B

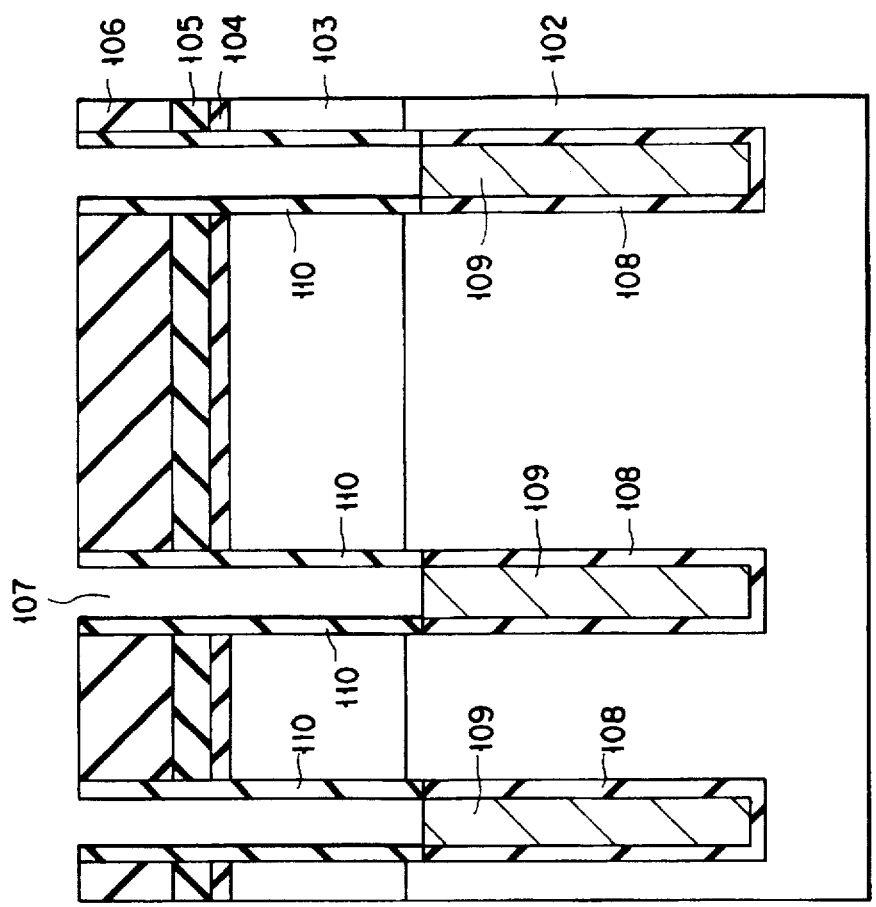
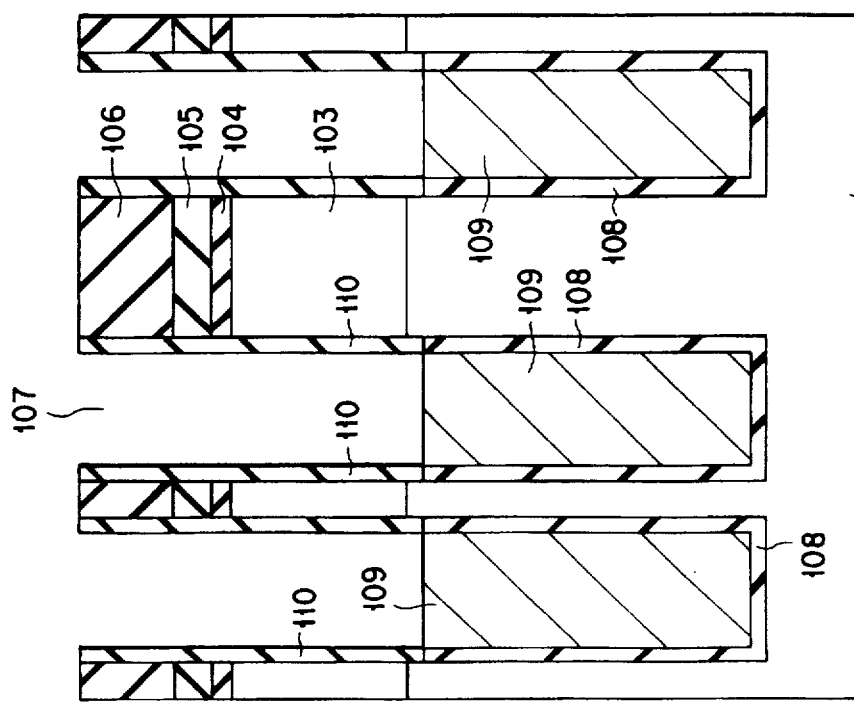
FIG. 4A
FIG. 4B

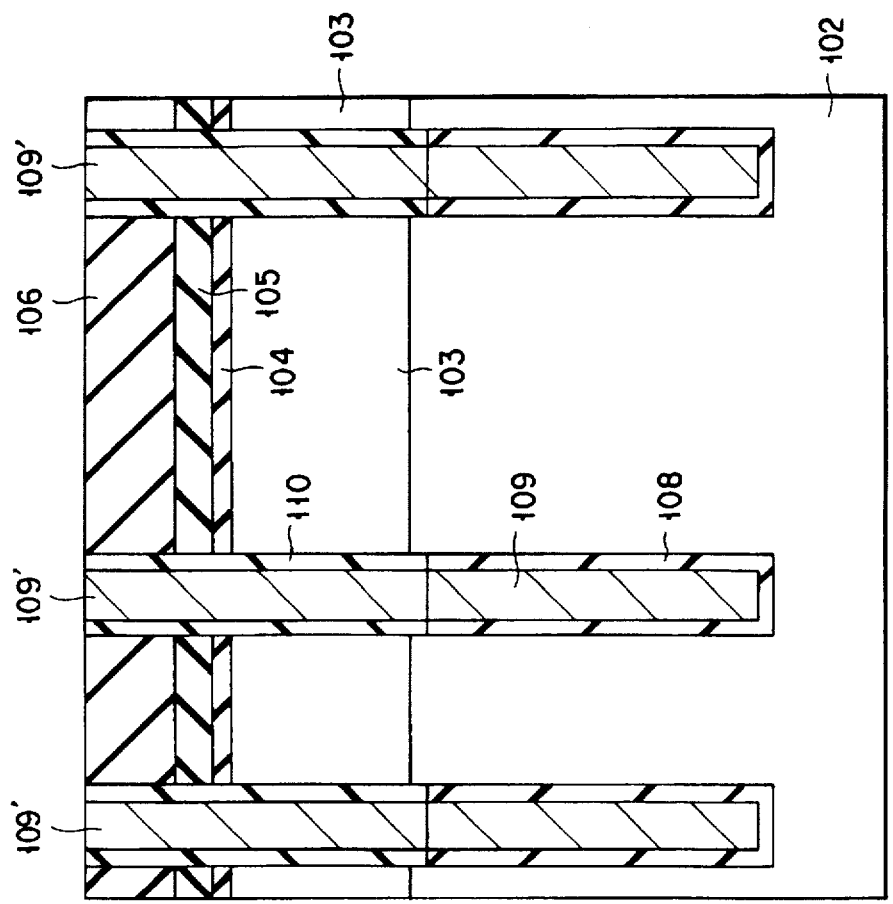
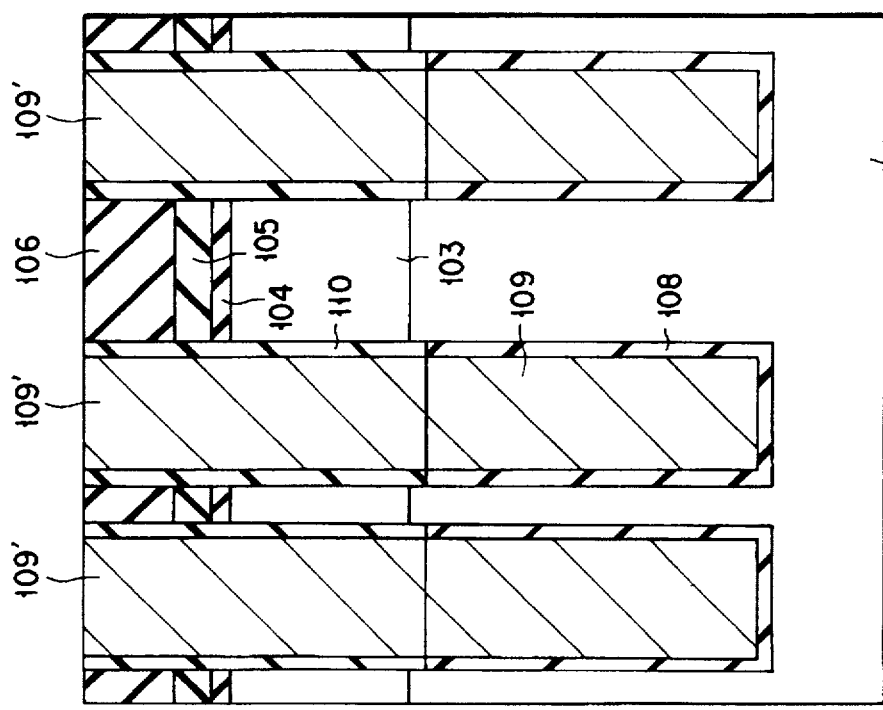

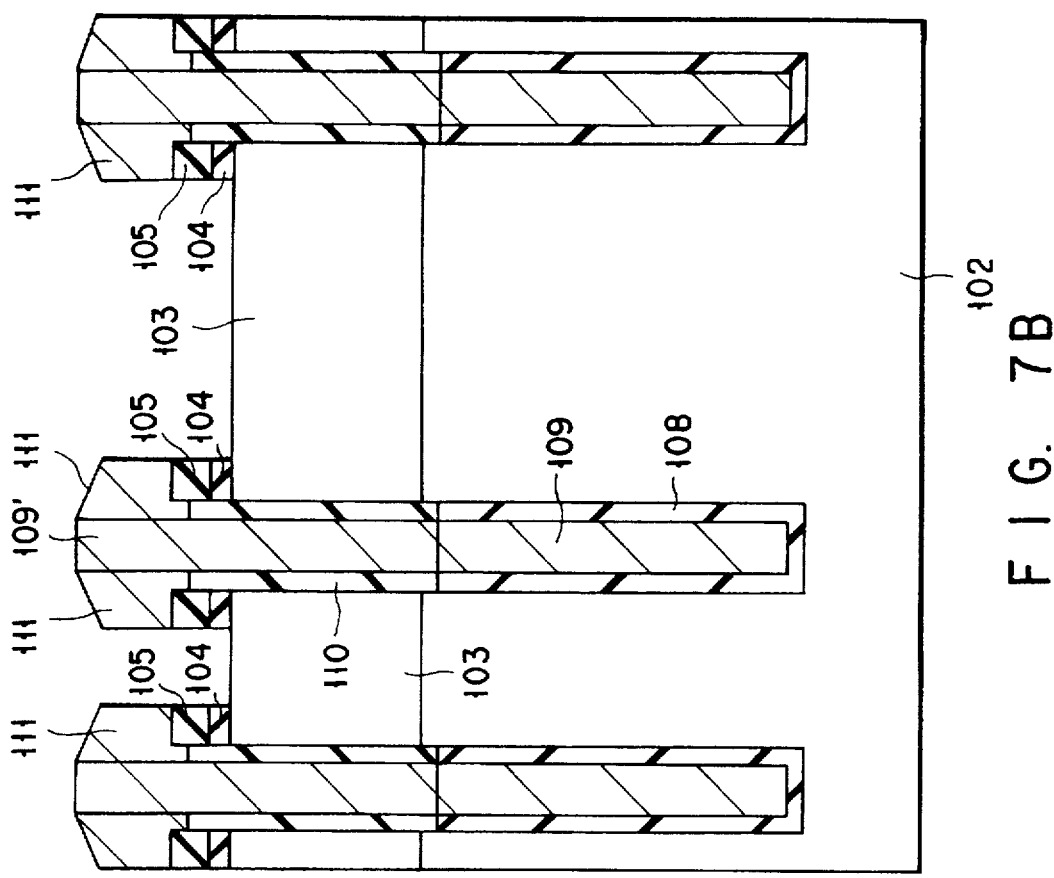
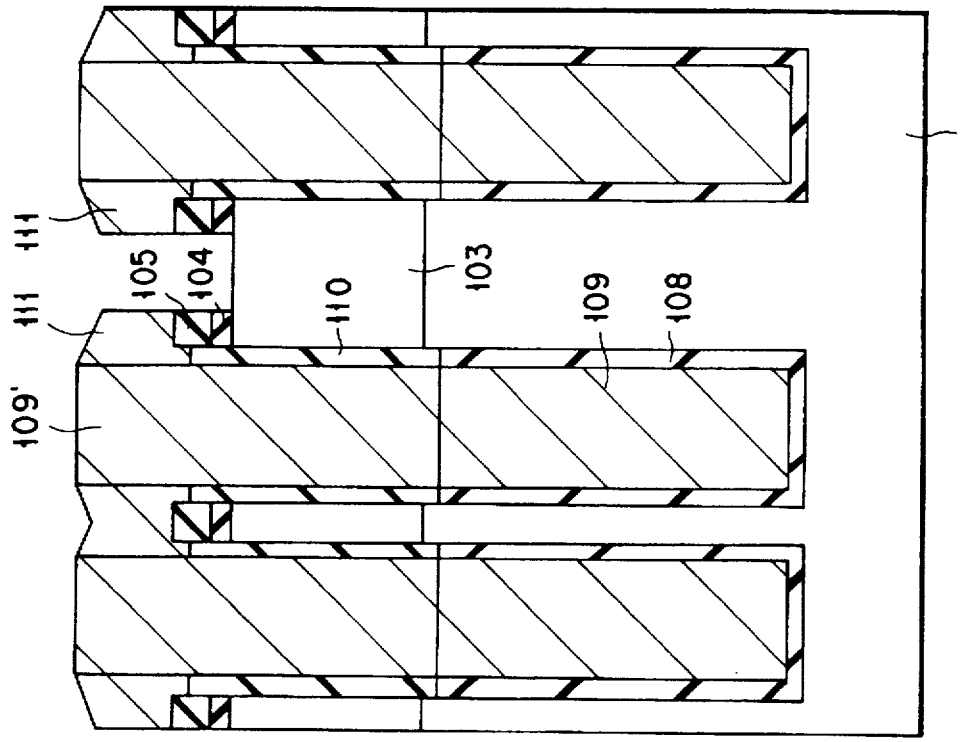
FIG. 7B
FIG. 7A

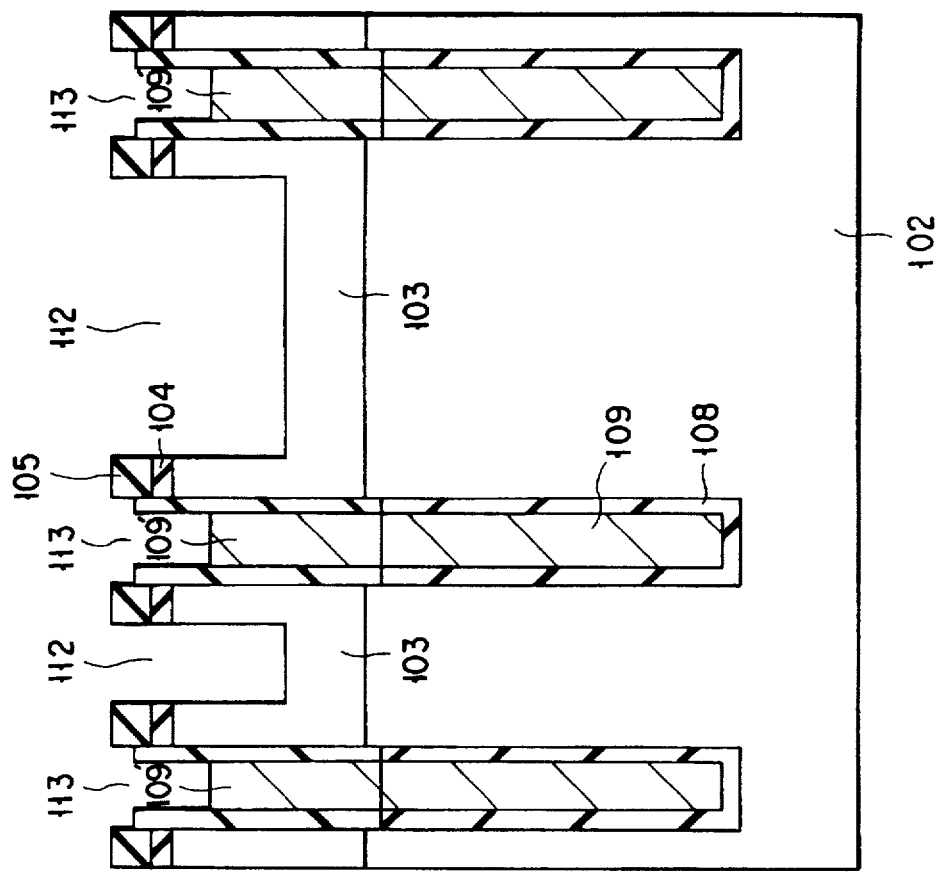
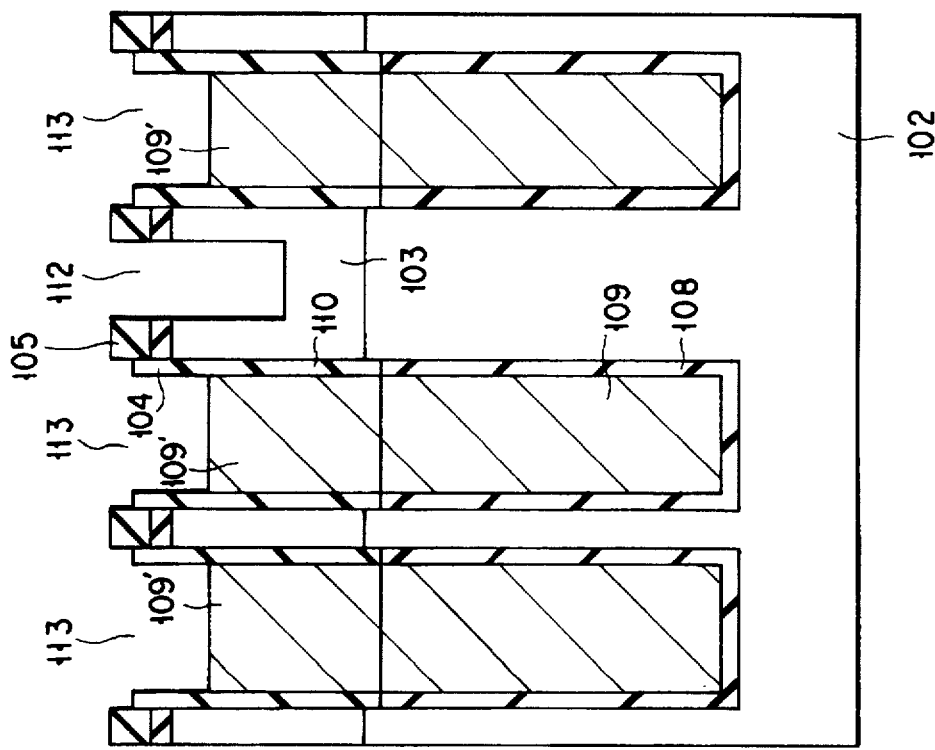

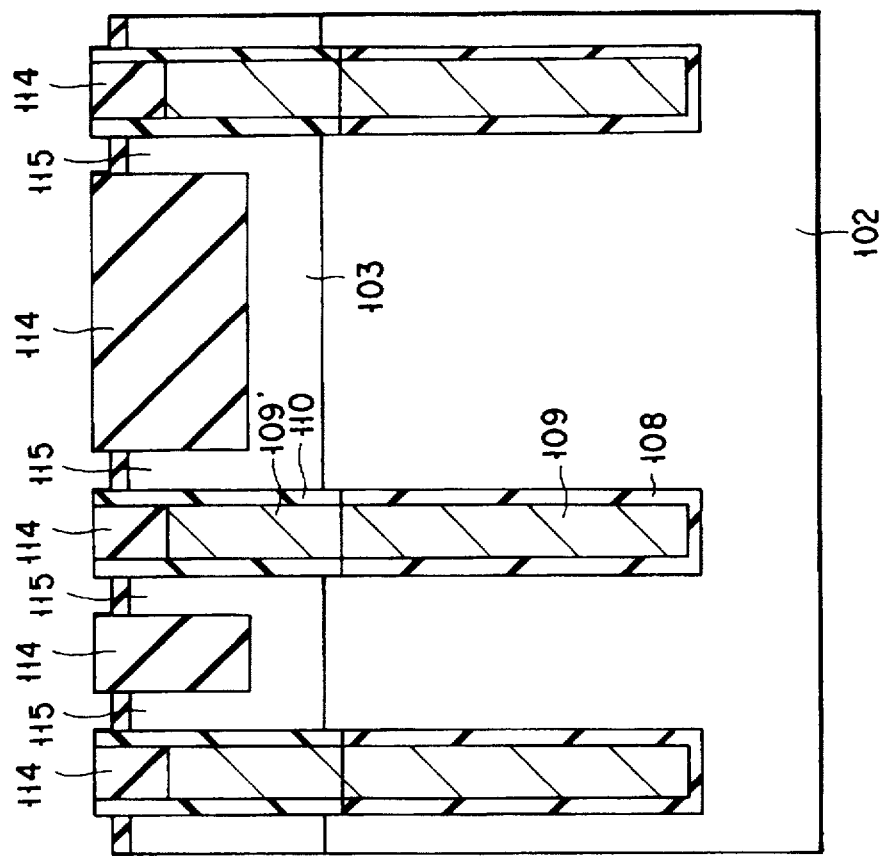
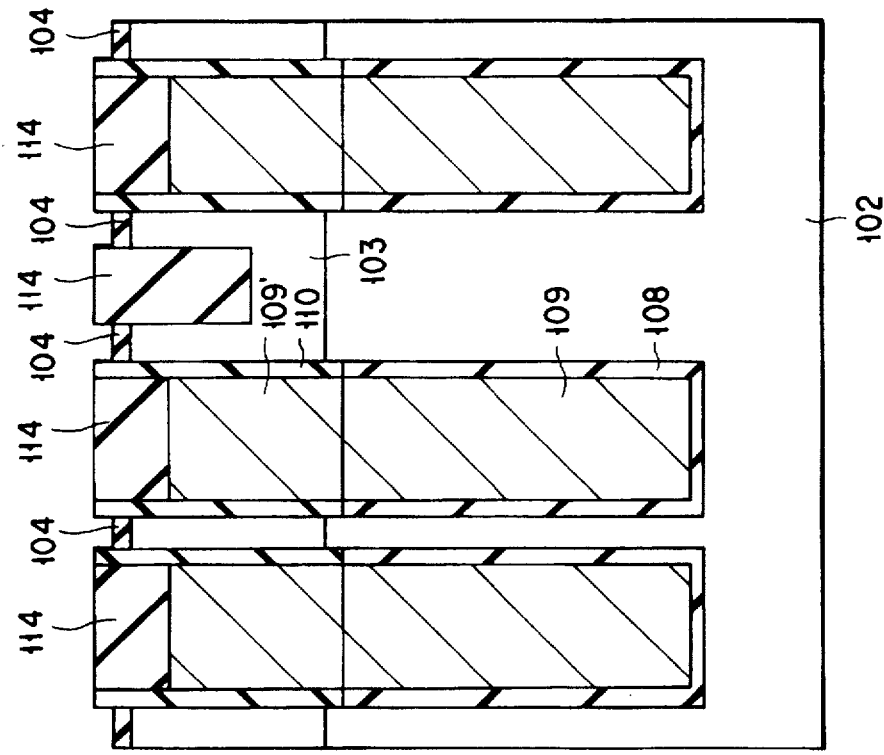
FIG. 9B
FIG. 9A

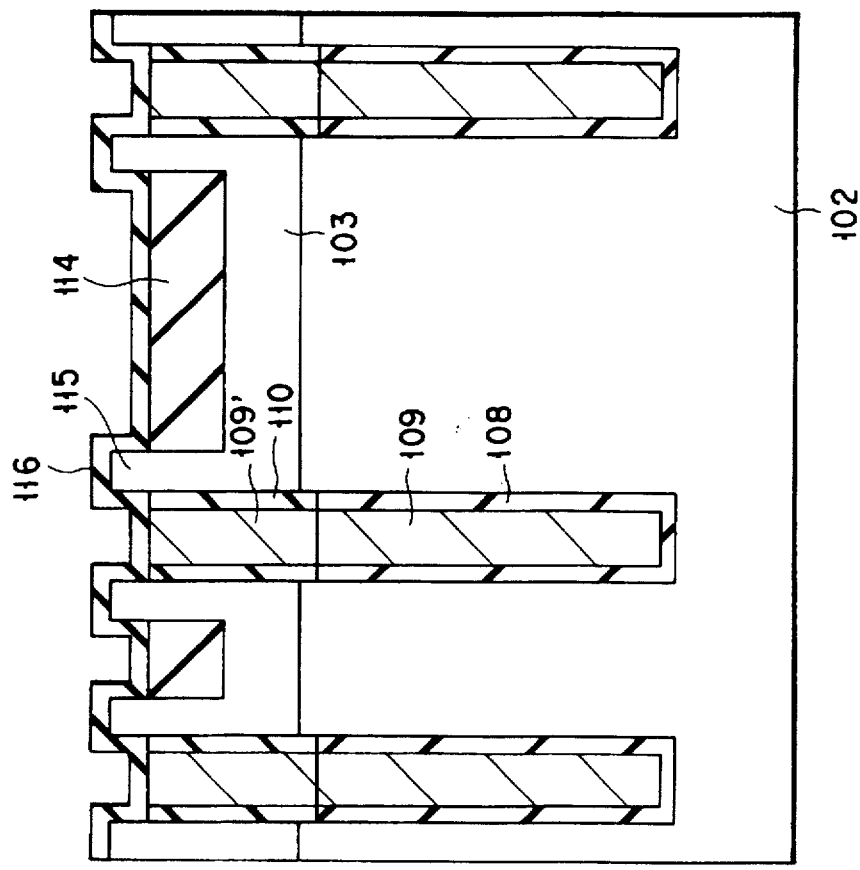
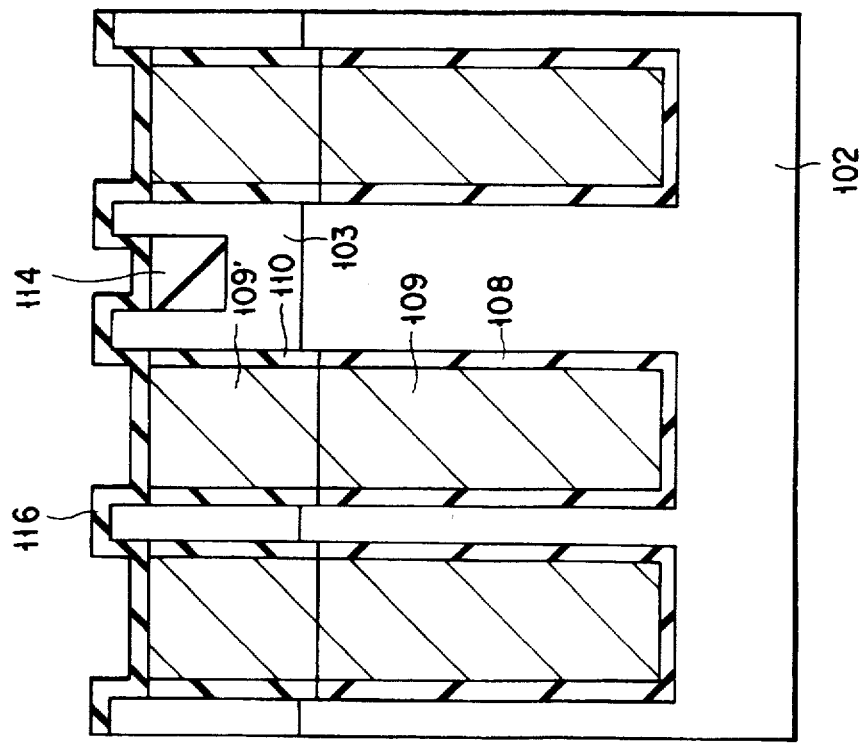
FIG. 10B
FIG. 10A

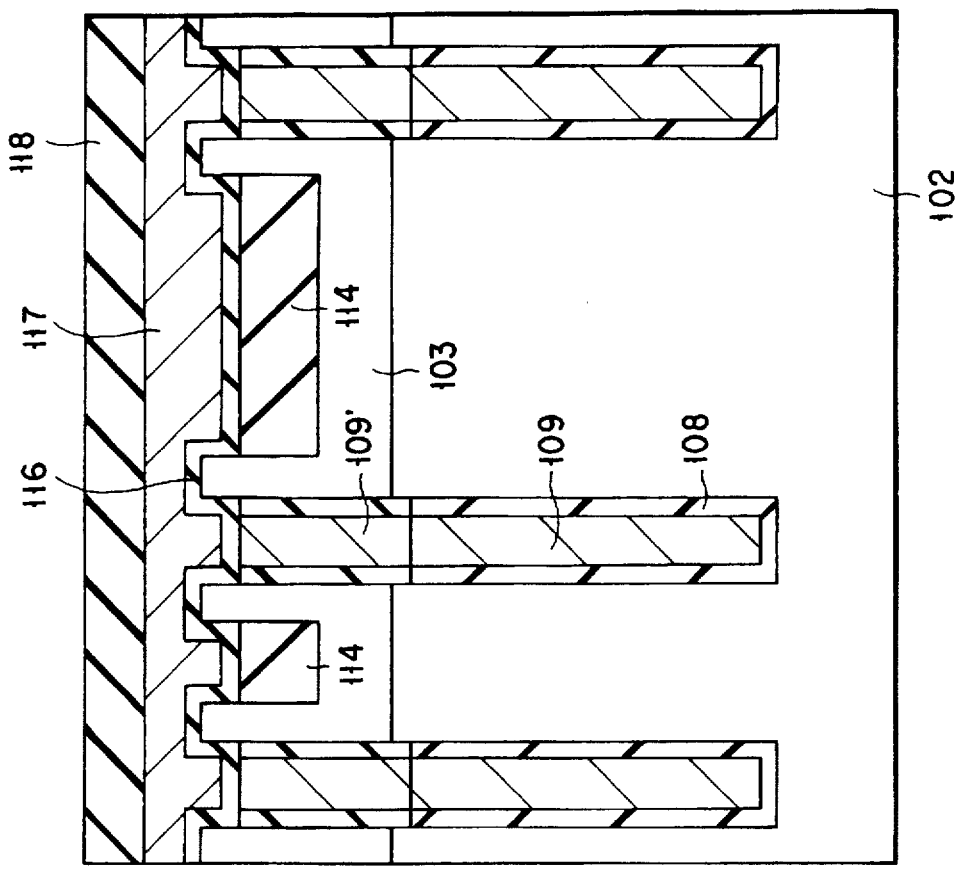
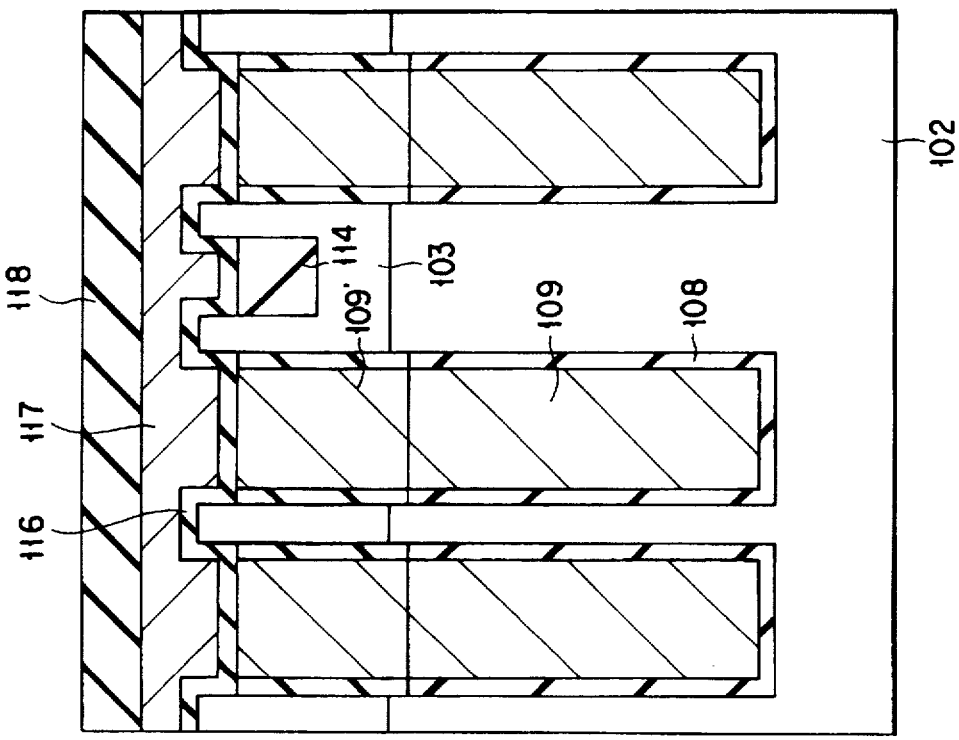
FIG. 11B
FIG. 11A

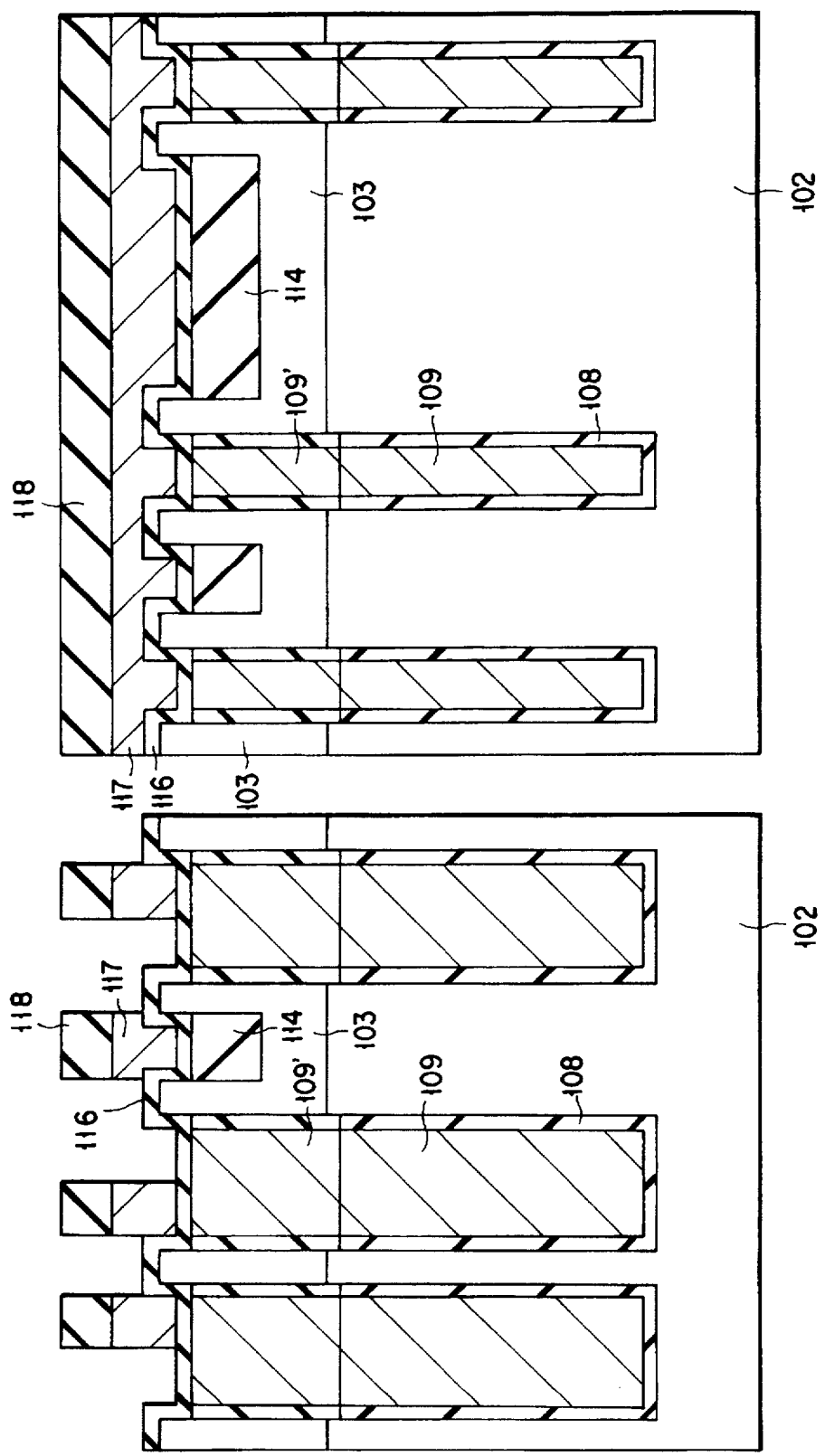

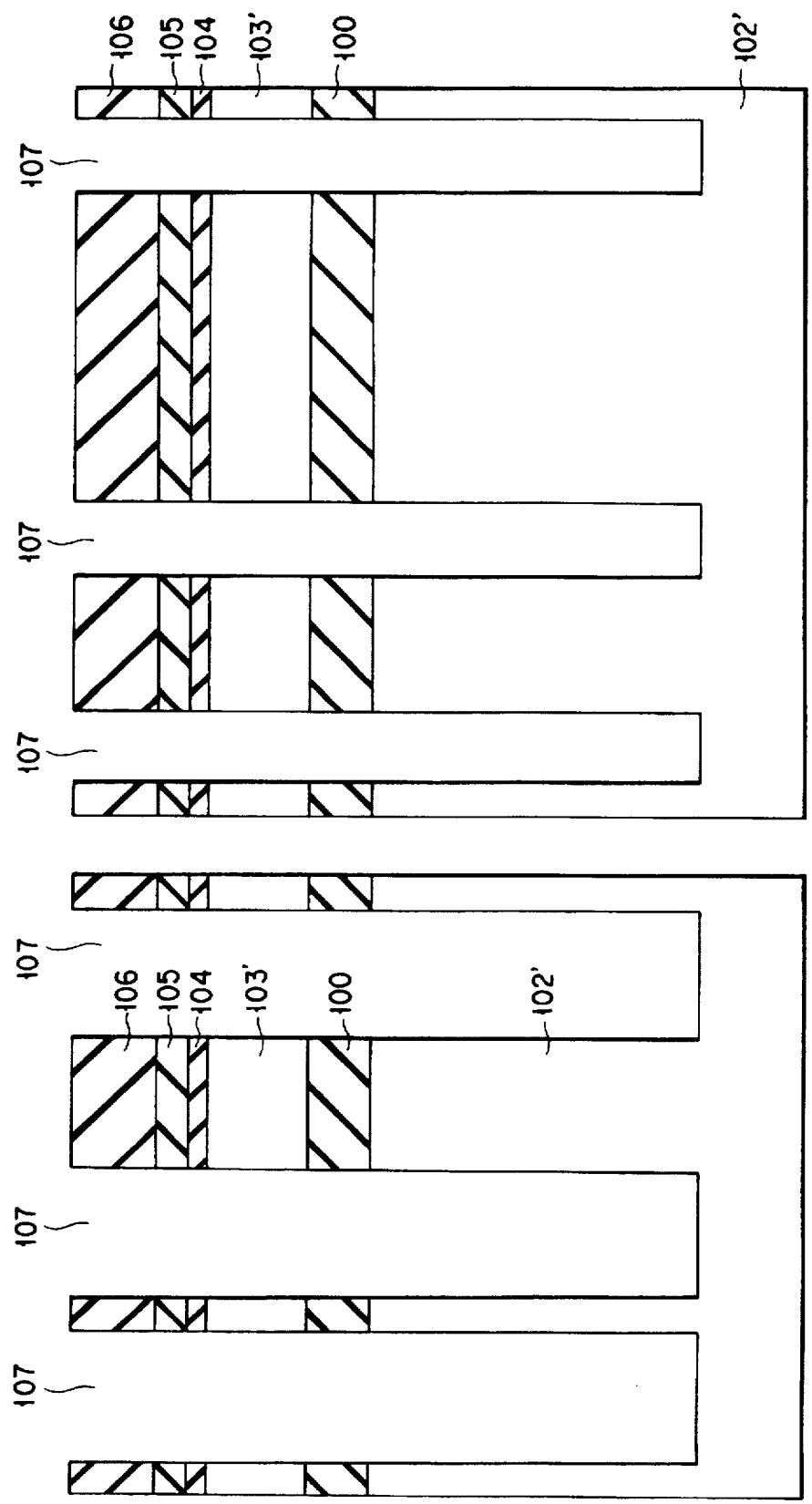

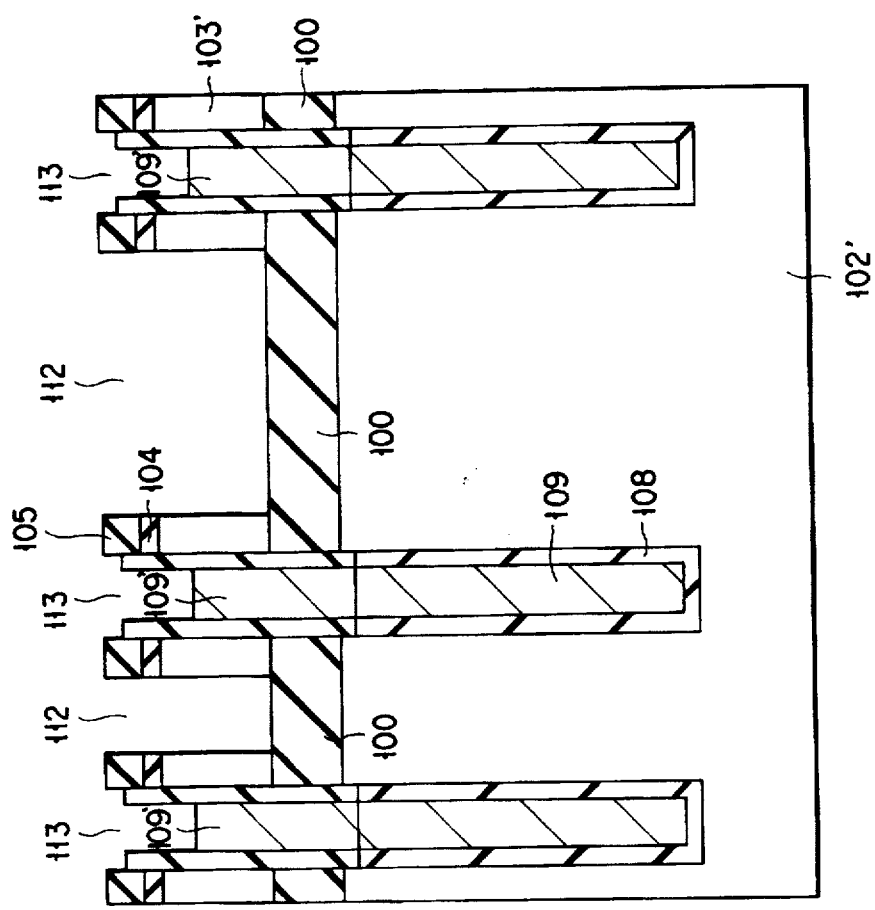
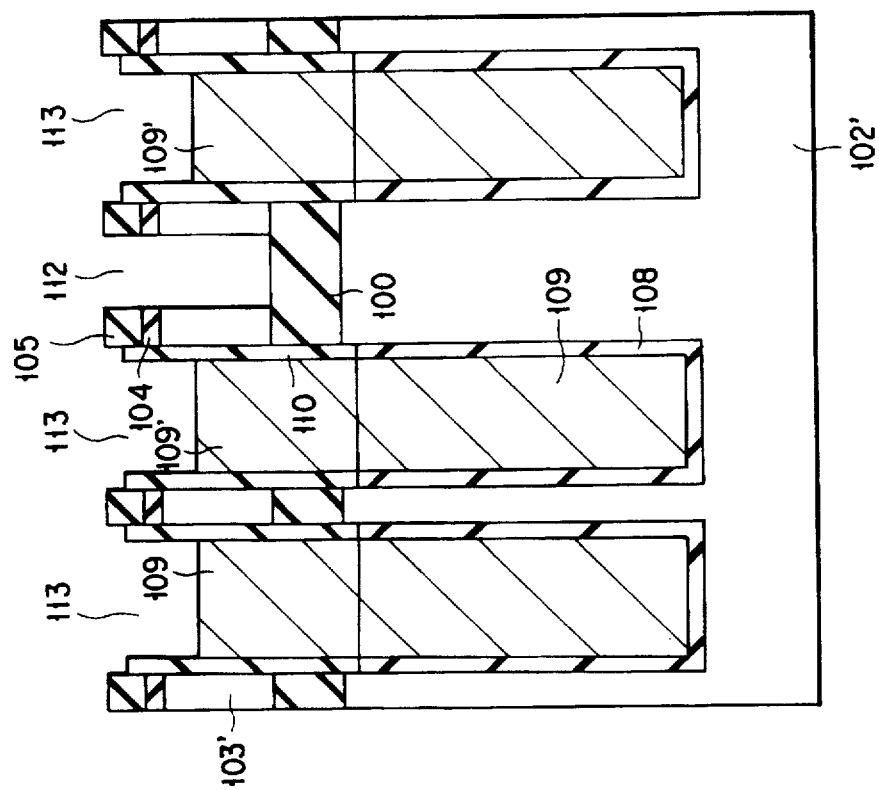
FIG. 17B
FIG. 17A

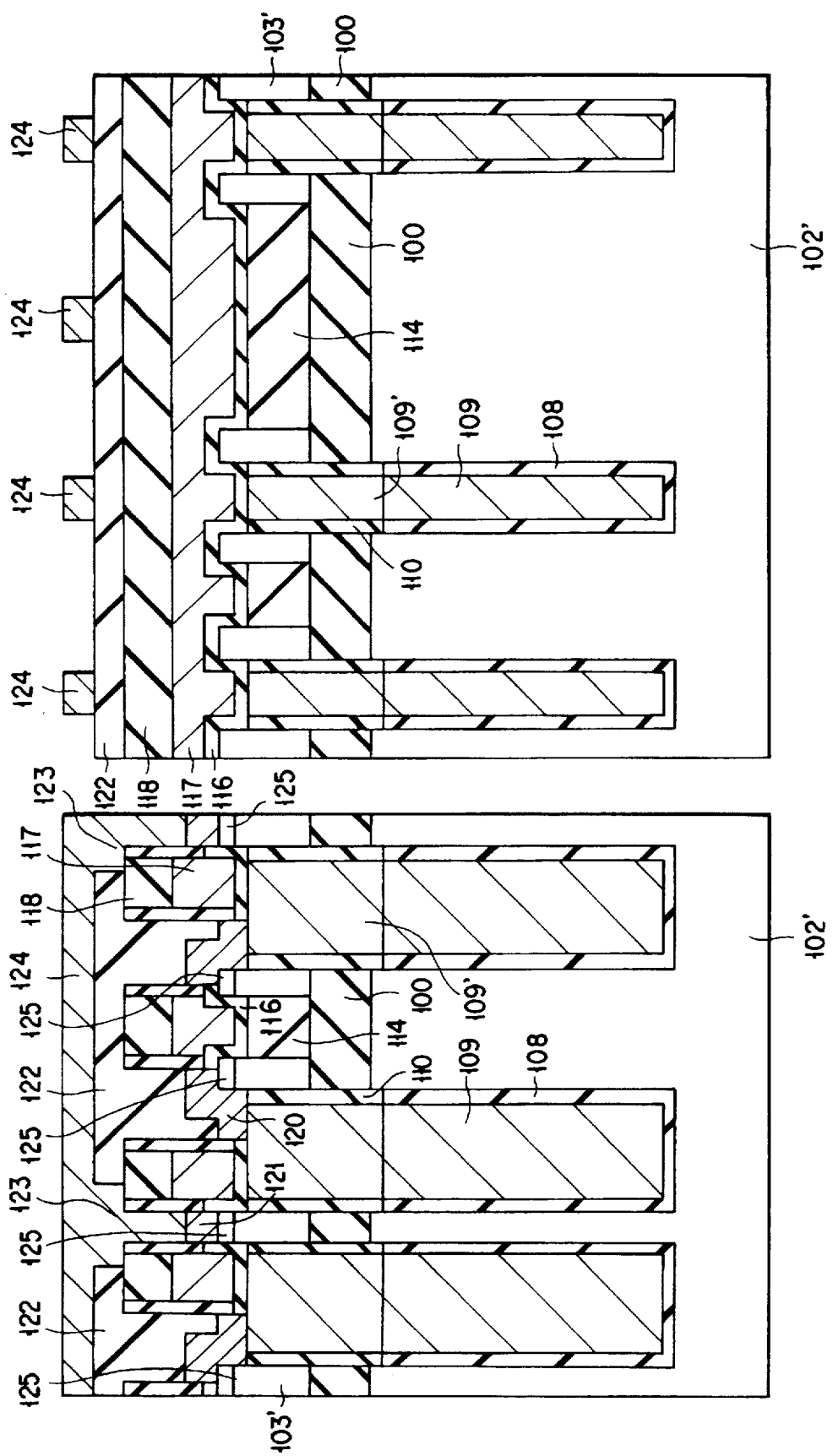

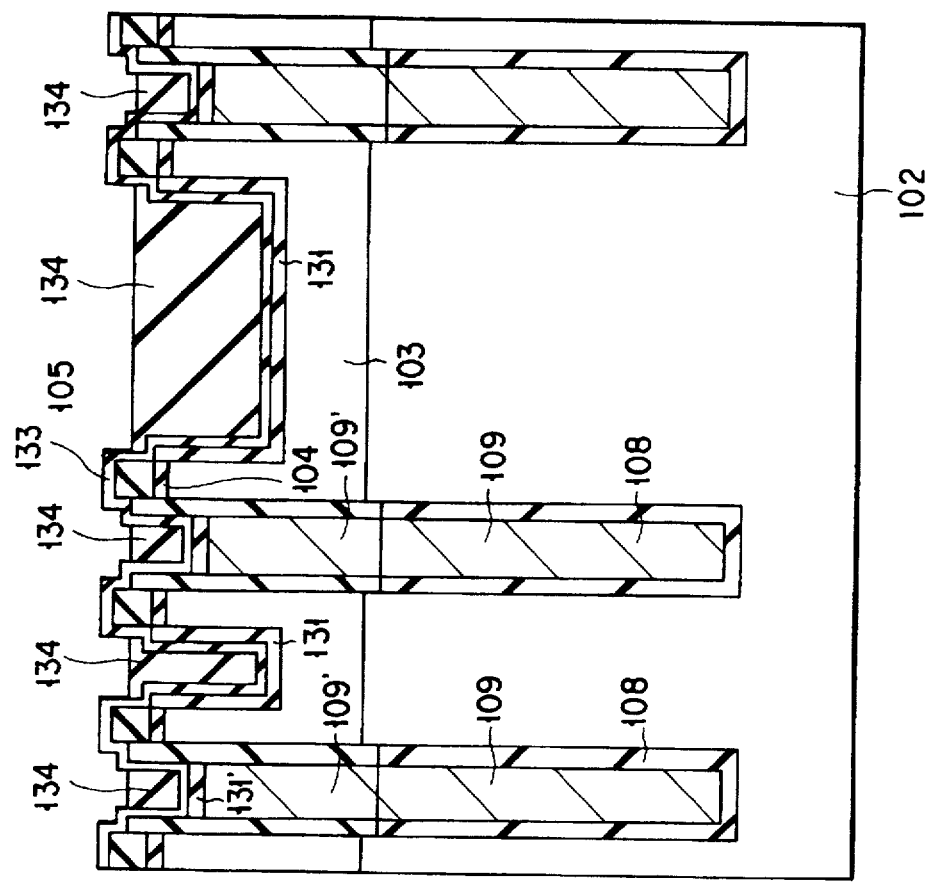
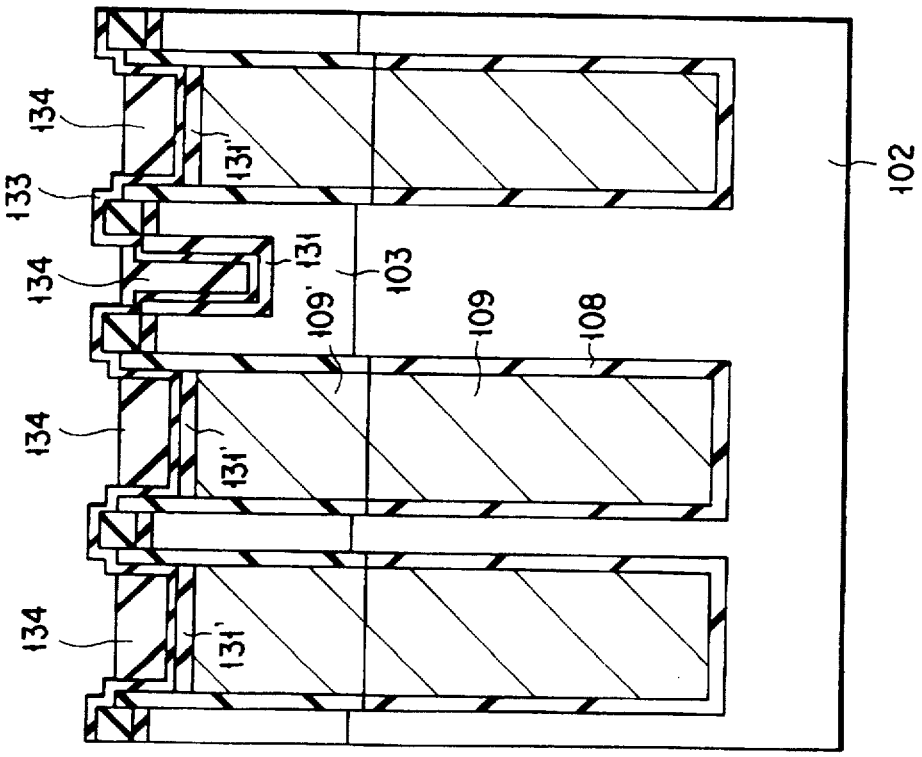
FIG. 20B
FIG. 20A

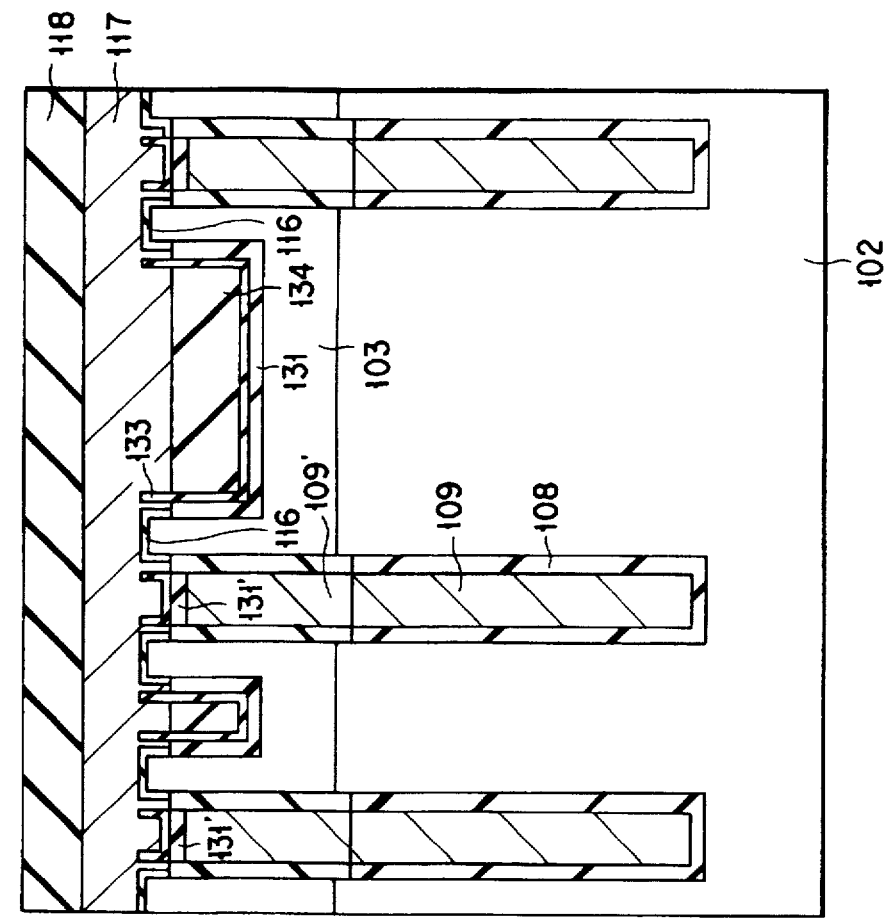
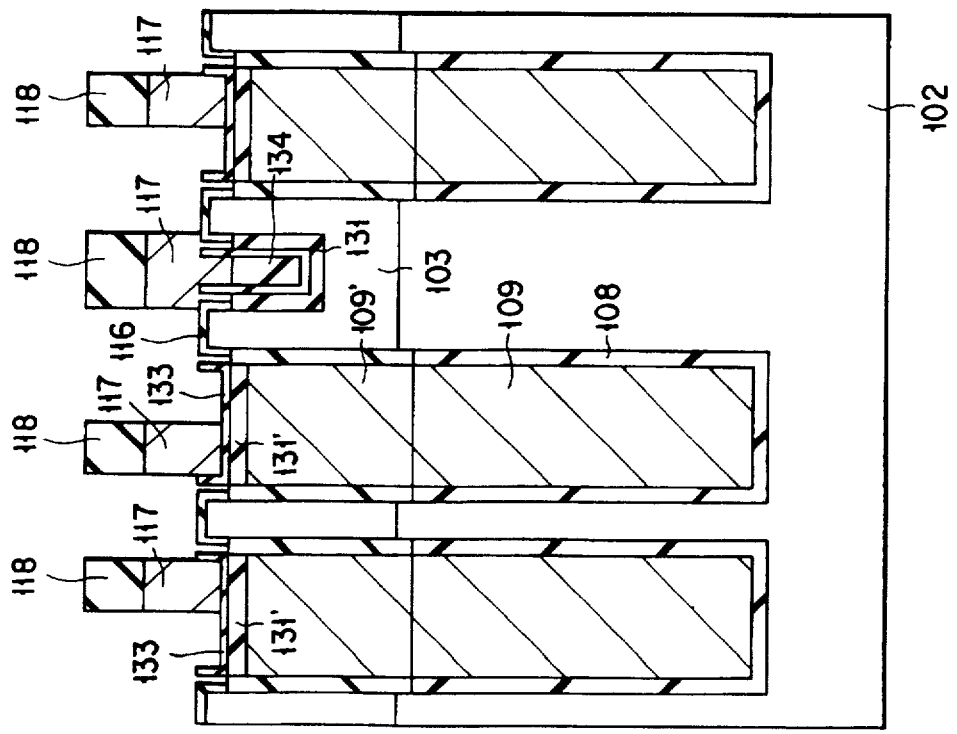
FIG. 23B
FIG. 23A

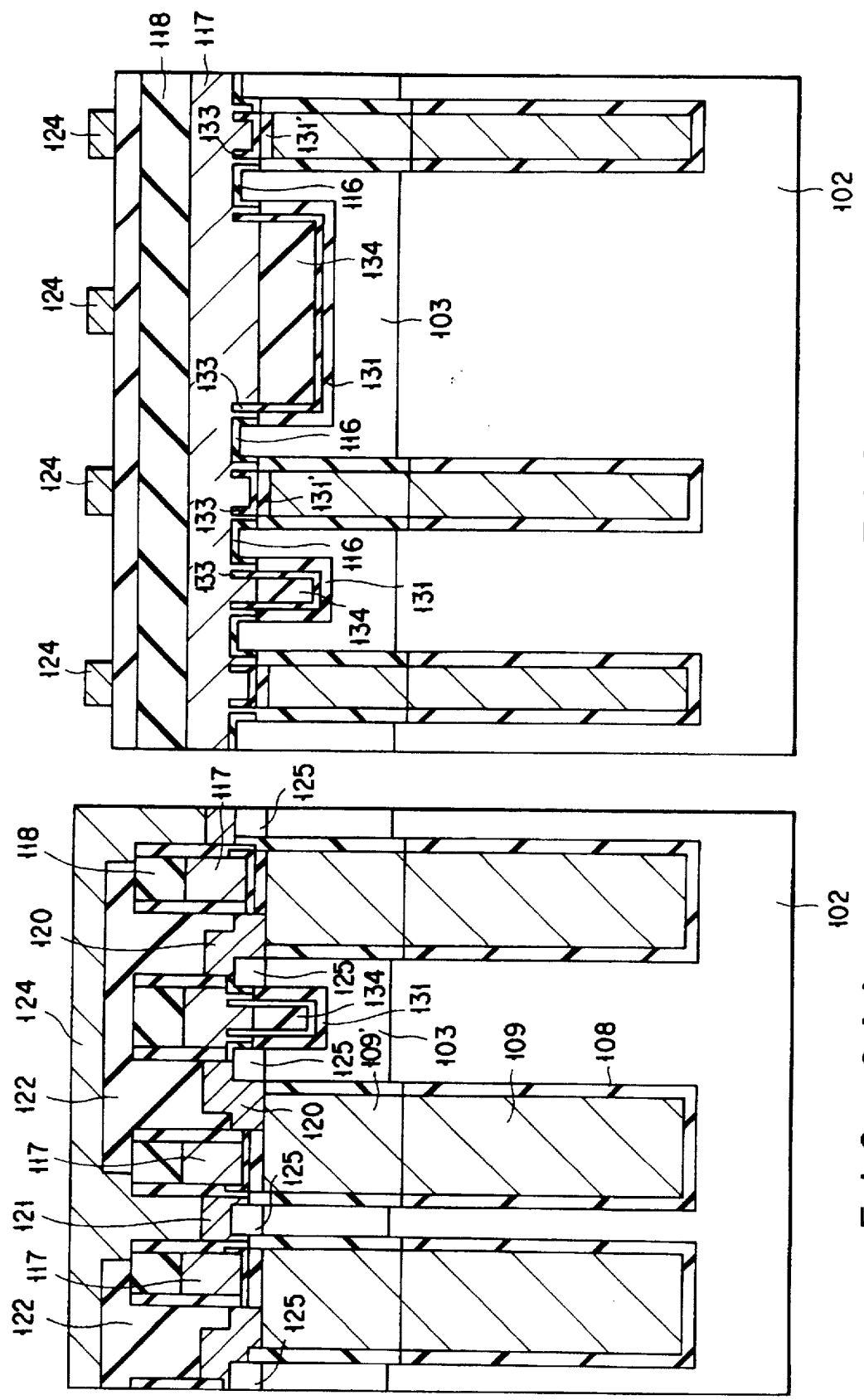

5,780,332

1

METHOD OF MANUFACTURING A SEMICONDUCTOR MEMORY DEVICE WITH A TRENCH CAPACITOR

BACKGROUND OF THE INVENTION

This invention relates to a semiconductor memory device and more particularly to a semiconductor memory device such as a DRAM with high integration density and a method for manufacturing the same.

With an increase in the integration density of a recent semiconductor integrated circuit, particularly a semiconductor memory device such as a DRAM (dynamic random access memory), the area of a memory cell tends to be reduced. Therefore, it becomes necessary to effect the fine patterning process and this increases the load on the lithography technology, and in the normal exposure technique, it becomes difficult to meet the requirement for the minimum processing size (which is hereinafter referred to as F) or the accuracy of alignment between patternings.

In order to alleviate the load for the lithography technology, the cell layout having the same memory cell area and capable of alleviating the requirement for the minimum processing size is proposed. For example, in a DRAM memory cell constructed by one transistor and one capacitor, an area of $8 \times F^2$ is required in the prior art if the minimum processing size (gate length) is set to F, but in the above memory cell, only an area of $4 \times F^2$ to $6 \times F^2$ is required. That is, since the memory cells of the same cell area can be processed with the larger minimum processing size, the load on the lithography technology can be reduced.

FIGS. 1A and 1B show a memory cell having an area of $6 \times F^2$ previously invented by the inventor of this application. FIG. 1A is a plan view of the memory cell and FIG. 1B is a cross sectional view taken along the line 1B—1B of FIG. 1A.

The memory cell is constructed by a cell transistor and a cell capacitor. The cell transistor has source and drain diffusion layers 71a, 71b formed on a semiconductor substrate 2 and a gate electrode 17 formed over the semiconductor substrate 2 with a gate insulating film 16 disposed therebetween and the gate electrode 17 constructs a word line. The cell capacitor is constructed by the semiconductor substrate 2 and a storage electrode 9 filled in an opening (trench) 7 formed in the semiconductor substrate 2 while a capacitor insulating film 8 is formed on the wall surface of the opening 7 and disposed between the wall surface and the storage electrode. The source or drain diffusion layer 71a of the transistor is connected to the storage electrode 9 of the capacitor via a connection electrode 73 and the other diffusion layer 71b of the transistor is connected to a bit line 24 via a bit line connection hole 23.

With the memory cell shown here, even when the gate electrode 17 is first formed and then the diffusion layers 71a, 71b are formed in self-alignment with the gate electrode 17, a certain area of the diffusion layer 71a can be stably obtained by setting the opening 7 in position shifted in a direction along the word line with respect to an element formation region 72, and therefore, it becomes possible to set the opening 7 and the gate electrode 17 close to each other, thus making it possible to attain the area of $6 \times F^2$.

However, with the above structure, the diffusion layer 71a is formed to have a width which is half the width of the element formation region 72 in the word line direction and thus the width becomes substantially half the minimum processing size. Therefore, in order to obtain a certain area of the diffusion layer 71a, it is required to accurately control

2 the processing dimensional precision and the accuracy of alignment between the patternings for the opening 7 and the element formation region 72. For example, if the area of the diffusion region 71a varies or the area therefor cannot be obtained, the contact resistance between the storage electrode 9 and the diffusion layer 71a increases or varies, thereby making it difficult to attain a stable operation of the memory cell.

The above problem occurs not only in the memory cell having the area of $6 \times F^2$ but also in a memory cell of other configuration such as a memory cell having an area of $8 \times F^2$.

Thus, in a conventional semiconductor memory device having an area of $6 \times F^2$ or the like and a method for manufacturing the same, if the processing dimensional precision and the accuracy of alignment, between the patternings for the opening in which the storage electrode is to be filled and the element formation region in which the transistor is formed, are not sufficiently high, it becomes difficult to obtain a sufficiently large area for the diffusion region of the transistor and the connection resistance between the transistor and the storage electrode increases, thereby preventing the stable operation of the semiconductor memory device.

BRIEF SUMMARY OF THE INVENTION

An object of this invention is to provide a semiconductor memory device capable of obtaining a certain area for the diffusion region of a transistor and reducing the connection resistance between the storage electrode and the diffusion region of the transistor to attain the stable operation without receiving any influence of the accuracy of alignment of the patterning and a method for manufacturing the same.

In order to attain the above object, a semiconductor memory device according to a first aspect of invention comprises a semiconductor substrate having a main surface; an element isolation insulating film formed on the main surface of the semiconductor substrate and buried in a first trench; a plurality of element formation regions each defined in an island form surrounded by the element isolation insulating film buried in the first trench; a plurality of second trenches formed in the plurality of element formation regions to be surrounded thereby, respectively; a plurality of capacitors formed in the plurality of second trenches, respectively, each of the capacitors having a plate electrode formed of the semiconductor substrate, a capacitor insulating film formed on an inner wall of each of the second trenches and a storage electrode formed in each of the second trenches with the capacitor insulating film disposed therebetween; a plurality of transistors formed in the plurality of element formation regions, respectively, each of the transistors having a gate electrode which is formed to extend over the semiconductor substrate and pass over corresponding one of the plurality of element formation regions and corresponding one of the second trenches surrounded thereby and which is disposed to be insulated from the storage electrode, corresponding one of the plurality of element formation regions and the semiconductor substrate, a first impurity diffusion layer formed on the corresponding one of the plurality of element formation regions on one side of the gate electrode, a second impurity diffusion layer formed on the corresponding one of the plurality of element formation regions on the other side of the gate electrode, and channel regions formed on the corresponding one of the plurality of element formation regions on both sides of corresponding one of the trenches below the gate electrode and respectively connected to the first and the second impurity diffusion layer; a plurality of connection electrodes each connecting the storage electrode to the first impurity diffusion layer; and a plurality of signal transmission lines each connected to the second impurity diffusion layer.

A semiconductor memory device according to a second aspect of this invention comprises a semiconductor substrate; an insulating layer formed on the semiconductor substrate; a semiconductor region formed on the insulating layer; an element isolation insulating film formed on the insulating layer to be connected thereto and buried in a first trench; a plurality of element formation regions each defined in an island form surrounded by the element isolation insulating film buried in the first trench; a plurality of second trenches formed in the plurality of element formation regions corresponding to the plurality of openings to penetrate the insulating layer and reach the semiconductor substrate; a plurality of capacitors each formed in the plurality of second trenches, respectively, each of the capacitors having a plate electrode formed of the semiconductor substrate, a capacitor insulating film formed on an inner wall of each of the second trenches and a storage electrode formed in each of the second trenches with the capacitor insulating film disposed therebetween; a plurality of transistors formed in the plurality of element formation regions, respectively, each of the transistors having a gate electrode which is formed to extend over the semiconductor region and pass over corresponding one of the plurality of element formation regions and corresponding one of the second trenches surrounded thereby and which is disposed to be insulated from the storage electrode, corresponding one of the plurality of element formation regions and the semiconductor region, a first impurity diffusion layer formed on the corresponding one of the plurality of element formation regions on one side of the gate electrode, a second impurity diffusion layer formed on the corresponding one of the plurality of element formation regions on the other side of the gate electrode, and channel regions formed on the corresponding one of the plurality of element formation regions on both sides of corresponding ones of the second trenches below the gate electrode and respectively connected to the first and the second impurity diffusion layer; a plurality of connection electrodes each connecting the storage electrode to the first impurity diffusion layer; and a plurality of signal transmission lines each connected to the second impurity diffusion layer.

It is preferable to make the following structures in the semiconductor memory devices of the first and second aspects.

Each of the channel regions is formed to have a constant width from one end of corresponding one of the second trenches towards an outside thereof. Each of the plurality of element formation regions projects from a surface of the storage electrode and the gate electrode is formed to insulatively cover a surface of a projected portion of a corresponding one of the plurality of element formation regions.

The channel regions are formed in an upper surface and side surfaces of the projected portion of each of the plurality of element formation regions below the gate electrode.

The gate electrode is insulated from the storage electrode by a silicon oxide film and a silicon nitride film disposed therebetween.

A method for manufacturing the semiconductor memory device of this invention is characterized in that the element isolation region is formed in self-alignment with the opening in which the storage electrode is filled.

That is, a method for manufacturing the semiconductor memory device according to a third aspect of this invention comprises the steps of forming a plurality of openings in a laminated insulating layer formed of at least two layers laminated on a semiconductor substrate; forming a plurality of trenches in the semiconductor substrate by using the laminated insulating layer having the plurality of openings as a mask; filling a plurality of storage electrodes into the plurality of trenches to a level which is at least higher than an under surface of the uppermost layer of the laminated insulating layer with capacitor insulating films disposed therebetween, respectively; removing the uppermost layer of the laminated insulating layer; forming first mask members on side walls of the plurality of storage electrodes which project as a result of removal of the uppermost layer, respectively; selectively etching the remaining portions of the laminated insulating layer with the first mask members used as masks to expose parts of the semiconductor substrate; etching the exposed parts of the semiconductor substrate to form a plurality of grooves; and filling a first insulating films at least in the plurality of grooves to form an element isolation region.

The method for manufacturing the semiconductor memory device of this invention may further comprise the steps of removing the first mask members to expose the laminated insulating layer left behind under the first mask members; removing the exposed laminated insulating layer to form partly exposed regions of the semiconductor substrate; forming gate insulating films on the partly exposed regions of the semiconductor substrate; forming a plurality of gate electrodes, each having a second insulating film thereon, on the gate insulating films, respectively; exposing parts of surfaces of the plurality of storage electrodes and first parts of a surface of the semiconductor substrate respectively adjacent to the plurality of storage electrodes; forming conductive layers extending from the exposed parts of the surfaces of the plurality of storage electrodes over to the first parts of the surface of the semiconductor substrate to connect the plurality of storage electrodes to the first parts of the surface of the semiconductor substrate, respectively; forming an inter-layer insulating film on the semiconductor substrate; selectively etching the inter-layer insulating film to expose second parts of the semiconductor substrate and form a plurality of bit line contact holes; and forming a plurality of bit lines formed on the inter-layer insulating film and connected to the second parts of the semiconductor substrate via the bit line contact holes.

Alternatively, it is possible to further provide a step of forming a third insulating film and a protection film at least on the plurality of storage electrodes after the step of removing the first mask members, wherein the protection film is formed of a material which can be left behind even after an etching process is effected in the step of exposing the semiconductor substrate by removing the laminated insulating layer.

It is possible to further provide a step of forming gate side wall insulating films at least on side surfaces of the plurality of gate electrodes, respectively, after the step of forming the plurality of gate electrodes.

The method for manufacturing the semiconductor memory device of this invention may further comprise the steps of removing the first mask members to expose the laminated insulating layer left behind under the first mask members; removing the exposed laminated insulating layer to partly expose the semiconductor substrate; forming a gate insulating films on the partly exposed regions of the semiconductor substrate; selectively forming a plurality of gate electrodes, each having a second insulating film thereon, on the gate insulating films, respectively; forming second mask members on regions of the semiconductor substrate in which a plurality of bit line contact holes are to be formed; etching the gate insulating film with at least the second mask members used as masks to expose first parts of the semiconductor substrate and respective parts of the plurality of storage electrodes; forming conductive layers extending from the respective parts of the plurality of storage electrodes over to the exposed first parts of the semiconductor substrate adjacent thereto to connect the plurality of storage electrodes to the exposed first parts of the semiconductor substrate; forming an interlevel insulating film at least on the conductive layers to expose the second mask members; removing the exposed second mask members; removing the gate insulating film lying under the second mask members to expose second parts of the semiconductor substrate; and forming a plurality of bit lines connected to the exposed second parts of the semiconductor substrate on the inter-layer insulating film.

Alternatively, it is possible to further provide a step of forming a fourth insulating film over an entire surface of the semiconductor substrate after the step of selectively forming the plurality of gate electrodes, and the step of etching the gate insulating film to expose the first parts of the semiconductor substrate and the respective parts of the storage electrodes and the step of removing the gate insulating film lying under the second mask members to expose the second parts of the semiconductor substrate may include a step of etching the fourth insulating film.

It is possible to further provide a step of forming first gate side wall insulating films on side surfaces of the plurality of gate electrodes with the fourth insulating film disposed therebetween except side surfaces thereof covered with the second mask members after the step of forming the second mask member on regions of the semiconductor substrate in which the plurality of bit line contact holes are to be formed.

It is possible to further provide a step of forming second gate side wall insulating films on the side surfaces of the plurality of gate electrodes with the fourth insulating film disposed therebetween after the step of removing the second mask members.

A method for manufacturing the semiconductor memory device according to a fourth aspect of this invention comprises the steps of forming a semiconductor region over a semiconductor substrate with a buried insulating layer disposed therebetween; forming a plurality of openings in a laminated insulating layer formed of at least two layers laminated on the semiconductor region; forming a plurality of trenches to penetrate the semiconductor region and the buried insulating layer and reach the semiconductor substrate by using the laminated insulating layer having the plurality of openings as a mask; filling a plurality of storage electrodes into the plurality of trenches to a level which is at least higher than an under surface of the uppermost layer of the laminated insulating layer with capacitor insulating films disposed therebetween, respectively; removing the uppermost layer of the laminated insulating layer; forming first mask members on side walls of the plurality of storage electrodes which project as a result of removal of the uppermost layer, respectively; selectively etching remaining portions of the laminated insulating layer with the first mask members used as a mask to expose parts of the semiconductor region; etching the exposed parts of the semiconductor region to form a plurality of grooves; and filling first insulating films at least in the plurality of grooves to form an element isolation region.

The method for manufacturing the semiconductor memory device of this invention may further comprise the steps of removing the first mask members to expose the laminated insulating layer left behind under the first mask members; removing the exposed laminated insulating layer to form partly exposed portions of the semiconductor region; forming gate insulating films on the partly exposed portions of the semiconductor region; forming a plurality of gate electrodes, each having a second insulating film thereon, on the gate insulating films, respectively; exposing parts of surfaces of the plurality of storage electrodes and first parts of the surface of the semiconductor region respectively adjacent to the plurality of storage electrodes; forming conductive layers extending from the exposed parts of the surfaces of the plurality of storage electrodes over to the first parts of the surface of the semiconductor region to connect the plurality of storage electrodes to the first parts of the surface of the semiconductor region, respectively; forming an inter-layer insulating film on the semiconductor region; selectively etching the interlayer insulating film to expose second parts of the semiconductor region and form a plurality of bit line contact holes; and forming a plurality of bit lines formed on the inter-layer insulating film and connected to the second parts of the semiconductor region via the bit line contact holes.

Thus, in the semiconductor memory device of this invention, since the element formation region is formed to surround the trenches in which the capacitors are formed, an area for the element formation region adjacent to the trench can be relatively stably secured in comparison with the conventional device in which the element formation region is formed in position adjacent to part of the trench. Therefore, when the element formation region and the storage electrode of the capacitor formed in the trench are connected to each other by use of the conductive layer (connection electrode), a sufficiently large contact area can be obtained between the conductive layer and the element formation region. Thus, the connection resistance between the storage electrode and the element region can be reduced and the operation can be made stable.

Since the gate electrode of the transistor is formed to pass over the trench, the size of the memory cell can be reduced. In this case, since the element formation region is formed in position adjacent to the trench to surround the trench, the channel regions can be formed separately on both sides of the trench on the surface of the element region which faces the gate electrode with the gate insulation film disposed therebetween. Therefore, even if the gate electrode is formed to pass over the trench, the area for the channel regions can be stably obtained and the transistor can be stably operated.

Further, in this invention, the storage electrode of the capacitor is formed in the trench, the capacitor insulating film is formed on the inner wall surface of the opening and the opposite electrode of the capacitor is formed of the semiconductor substrate, the storage electrode and the semiconductor substrate can be separated from each other by the capacitor insulating film formed on the inner wall surface of the trench. Therefore, the element region formed in position adjacent to the trench and the storage electrode can be easily separated from each other.

Further, in this invention, the gate electrode is formed to pass over the trench and the source and drain regions of the transistor are formed in the element regions adjacent to the trench. If the storage electrode is thus formed in the semiconductor substrate, it is required to form a new isolation layer or the like, for example, in order to separate the storage electrode from the diffusion region which is one of the source and drain regions of the transistor of a cell adjacent to the storage electrode and which is connected to the bit line. However, in this invention, since the storage electrode and the semiconductor substrate are separated from each other by means of the capacitor insulating film, it is not necessary to form a new separation layer.

Thus, the storage electrode and one of the source and drain regions which is connected to the bit line can be securely separated from each other. Further, the manufacturing process can be simplified.

Further, in the semiconductor memory device of this invention, since the element formation region is formed to have a constant width from one end of the trench towards the outside of the trench, a preset area for the element formation region can be obtained in a portion around the trench. Therefore, even if the gate electrode is formed to pass over the trench and the channel regions are separated on both sides of the trench, the transistor may have a sufficiently large channel width and the operation of the transistor can be made stable.

Further, since a preset area for the element formation region can be obtained in a portion around the trench, a sufficiently large contact area can be obtained between the element formation region and the connecting electrode for connecting the storage electrode and the element formation region to each other can be obtained. Therefore, the connection resistance can be reduced and the memory cell can be stably operated.

Since the element formation region projects from the surface of the storage electrode and the gate electrode is formed to cover the projected surface of the element region, not only the upper surface of the element region but also the projected side surfaces can be used as the channel regions of the transistor. Therefore, the channel width can be increased, the driving ability of the transistor can be enhanced and the operation thereof can be made stable.

Further, in the manufacturing process of the semiconductor memory device of this invention, the element isolation region is formed by forming the mask member in self-alignment with the side wall of the storage electrode which is filled in the trench and projects from the semiconductor substrate surface and filling the insulating films into the grooves formed in the semiconductor substrate with the mask members used as a mask. Therefore, the element isolation region can be formed in self-alignment with the trench.

Since the semiconductor substrate surface lying under the mask member can be used as the element formation region by removing the mask member, the area of the diffusion region of the transistor can be stably made large. Thus, a sufficiently large area for the diffusion region of the transistor can be obtained without being influenced by the accuracy of alignment between the patternings of the trench and the element formation region, the connection resistance between the storage electrode and the diffusion region of the transistor can be reduced and the stable operation of the semiconductor memory device can be attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL
VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A and 2B are views for illustrating the structure of a semiconductor memory device (DRAM) according to this invention, FIG. 2A being a schematic plan view and FIG. 2B being a perspective view;

Figure 32A:
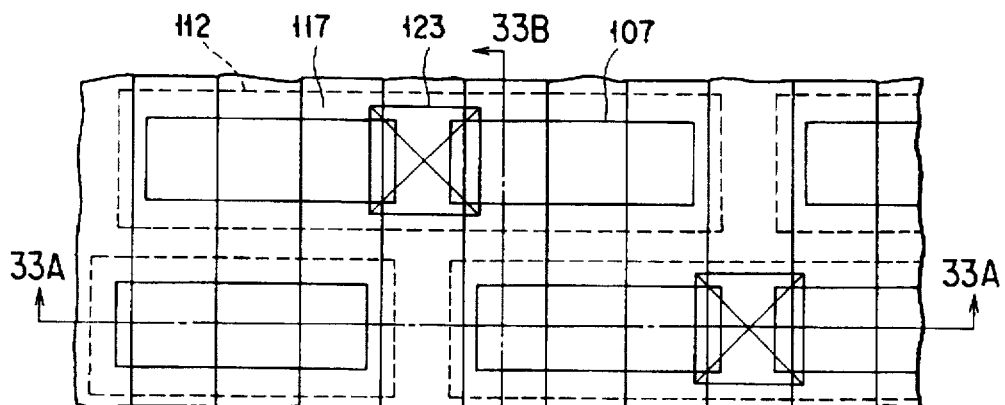
Figure 32B:
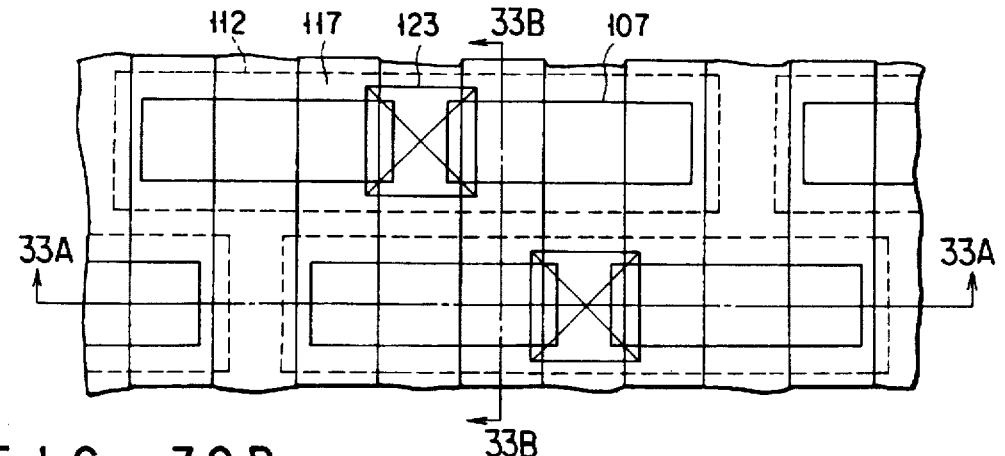
Figure 33B:
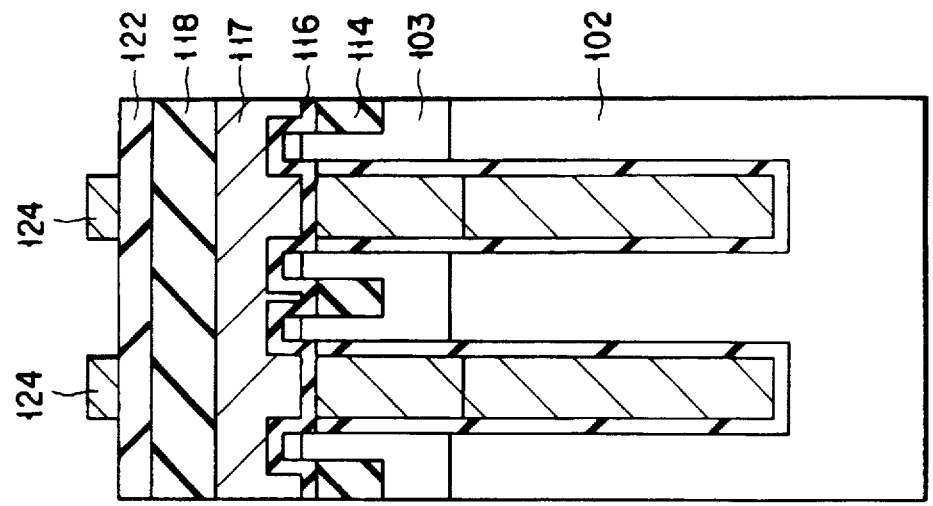
Figure 33A:
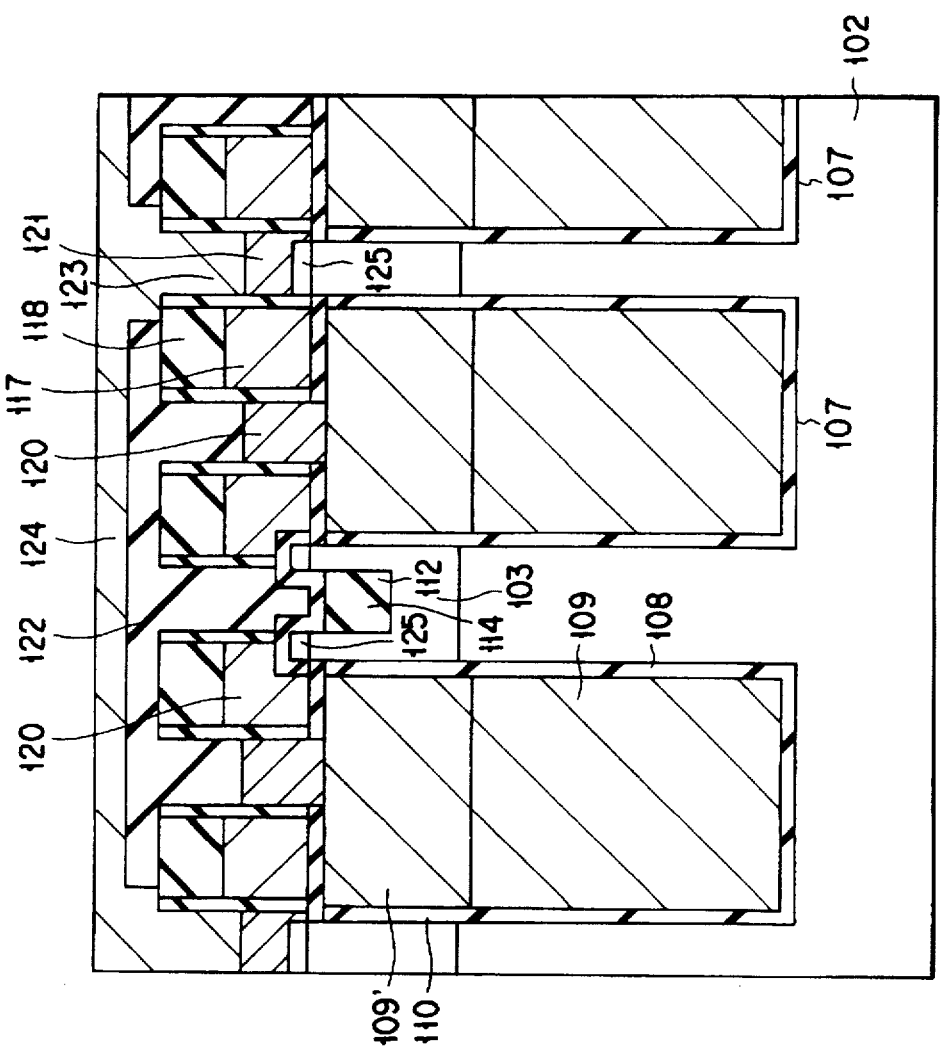
Figure 34A:
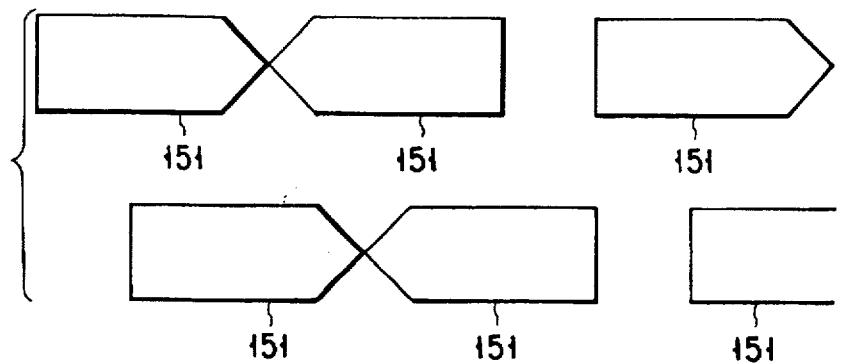
Figure 34B:
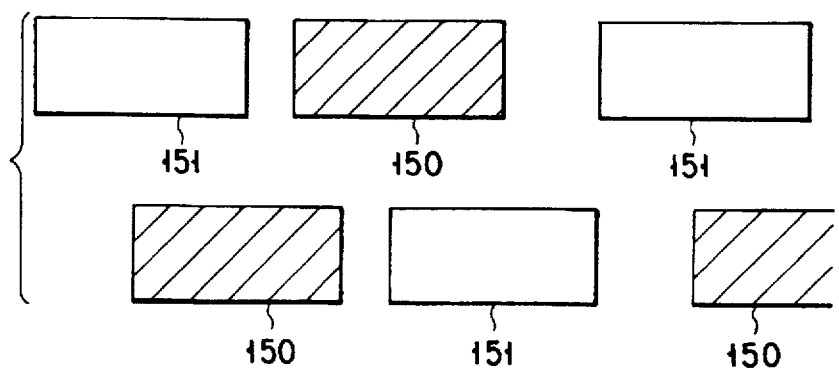
Figure 34C:
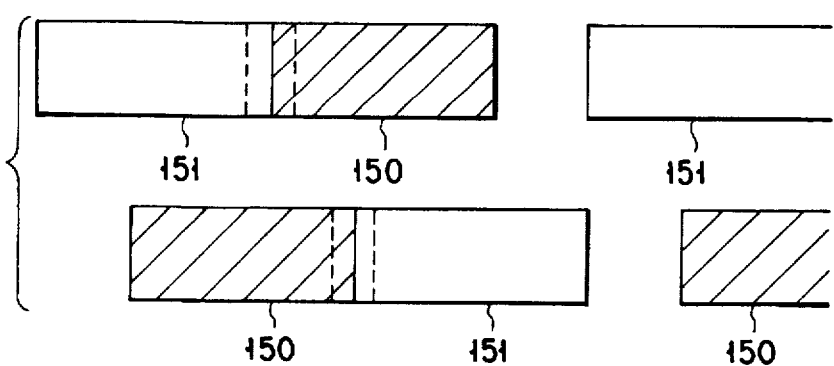

FIGS. 3A,4A,5A,6A,7A,8A,9A,10A,11A,12A,13A,14A, and 15A are cross sectional views corresponding to the cross sectional view taken along the line 3A—3A of FIG. 2A, for illustrating the steps of a method for manufacturing a semiconductor device according to a first embodiment of this invention;

FIGS. 3B,4B,5B,6B,7B,8B,9B,10B,11B,12B,13B,14B, and 15B are cross sectional views corresponding to the cross sectional view taken along the line 3B—3B of FIG. 2A, for illustrating the steps of the method for manufacturing the semiconductor device according to the first embodiment of this invention;

FIGS. 16A,17A,and 18A are cross sectional views corresponding to the cross sectional view taken along the line 3A—3A of FIG. 2A, for illustrating a method for manufacturing the semiconductor device according to a modification of the first embodiment of this invention;

FIGS. 16B,17B,and 18B are cross sectional views corresponding to the cross sectional view taken along the line 3B—3B of FIG. 2A, for illustrating a method for manufacturing the semiconductor device according to the modification of the first embodiment of this invention;

FIGS. 19A,20A,21A,22A,23A,and 24A are cross sectional views corresponding to the cross sectional view taken along the line 3A—3A of FIG. 2A, for illustrating the steps of a method for manufacturing a semiconductor device according to a second embodiment of this invention;

FIGS. 19B,20B,21B,22B,23B,and 24B are cross sectional views corresponding to the cross sectional view taken along the line 3B—3B of FIG. 2A, for illustrating the steps of the method for manufacturing the semiconductor device according to the second embodiment of this invention;

FIGS. 25,26,27,28,29,30,and 31 are enlarged views corresponding to the cross sectional view taken along the line 3A—3A of FIG. 2A, for illustrating the steps of a method for manufacturing a semiconductor device according to a third embodiment of this invention;

FIGS. 32A and 32B are schematic plan views of a semiconductor device according to a fourth embodiment of this invention, FIG. 32A showing an example of a DRAM of ½ pitch array and FIG. 32B showing an example of a DRAM of ¼ pitch array;

FIG. 33A is a cross sectional view taken along the line 33A—33A of FIGS. 32A and 32B, for illustrating a semiconductor device according to the fourth embodiment of this invention;

FIG. 33B is a cross sectional view taken along the line 33B—33B of FIGS. 32A and 32B, for illustrating the semiconductor device according to the fourth embodiment of this invention; and FIGS. 34A,34B,and 34C are plan views showing examples of mask patterns for attaining the width less than the minimum processing size in a method for manufacturing a semiconductor memory device according to this invention.

DETAILED DESCRIPTION OF THE INVENTION

There will now be described embodiments of this invention with reference to the accompanying drawings.

(First Embodiment)

FIG. 2A is a plan view of a DRAM according to a first embodiment of this invention, and FIG. 2B is a perspective view of the DRAM. Gate electrodes 117 and trenches 107 in which storage electrodes are filled are formed one on each side of a bit line connection hole 123 connected to a bit line 124, and the two trenches for each bit line connection hole make a pair and an element isolation groove 112 is formed around the pair of trenches. This invention is characterized in that the element isolation groove 112 is formed in self-alignment with the trench 107 for storage electrode.

Next, a method for manufacturing the semiconductor device according to the first embodiment of this invention is explained with reference to FIGS. 3A, 3B to 15A, 15B.

First, an N-well 102 is formed in a P-type silicon substrate (not shown) and a P-well 103 is formed in the N-well. In the drawings of this embodiment, the cross sections of elements formed in a laminated portion of the N-well and P-well are shown. Then, a trench mask (used for forming trenches by etching) formed of a silicon oxide film (SiO$_2$) 104, silicon nitride film 105 and silicon oxide film 106 is formed.

Figure 1A:
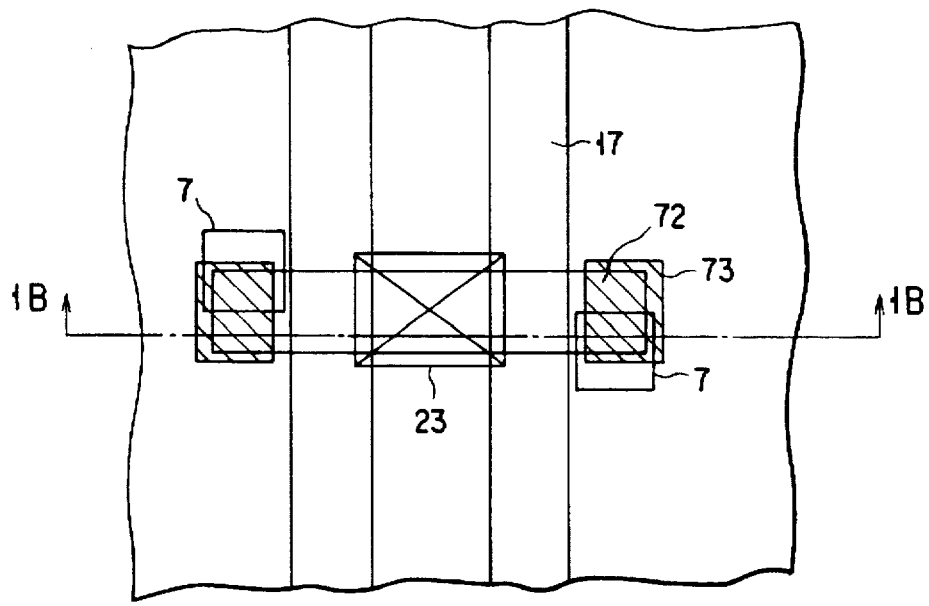
FIGS. 1A and 1B are views for illustrating the structure of the conventional DRAM, FIG. 1A being a schematic plan view and FIG. 1B being a cross sectional view taken along the line 1B—1B of FIG. 1A.
Figure 1B:
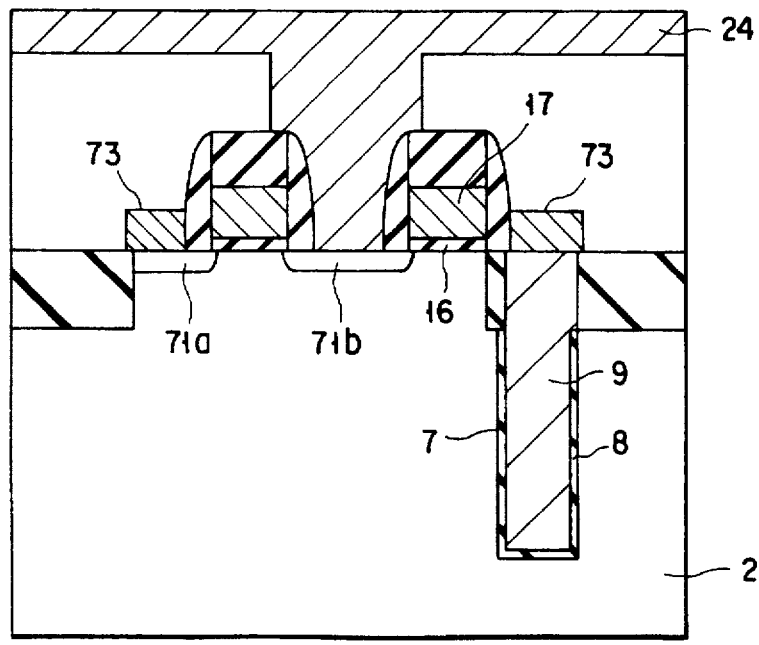
Figures 3A, 3B:
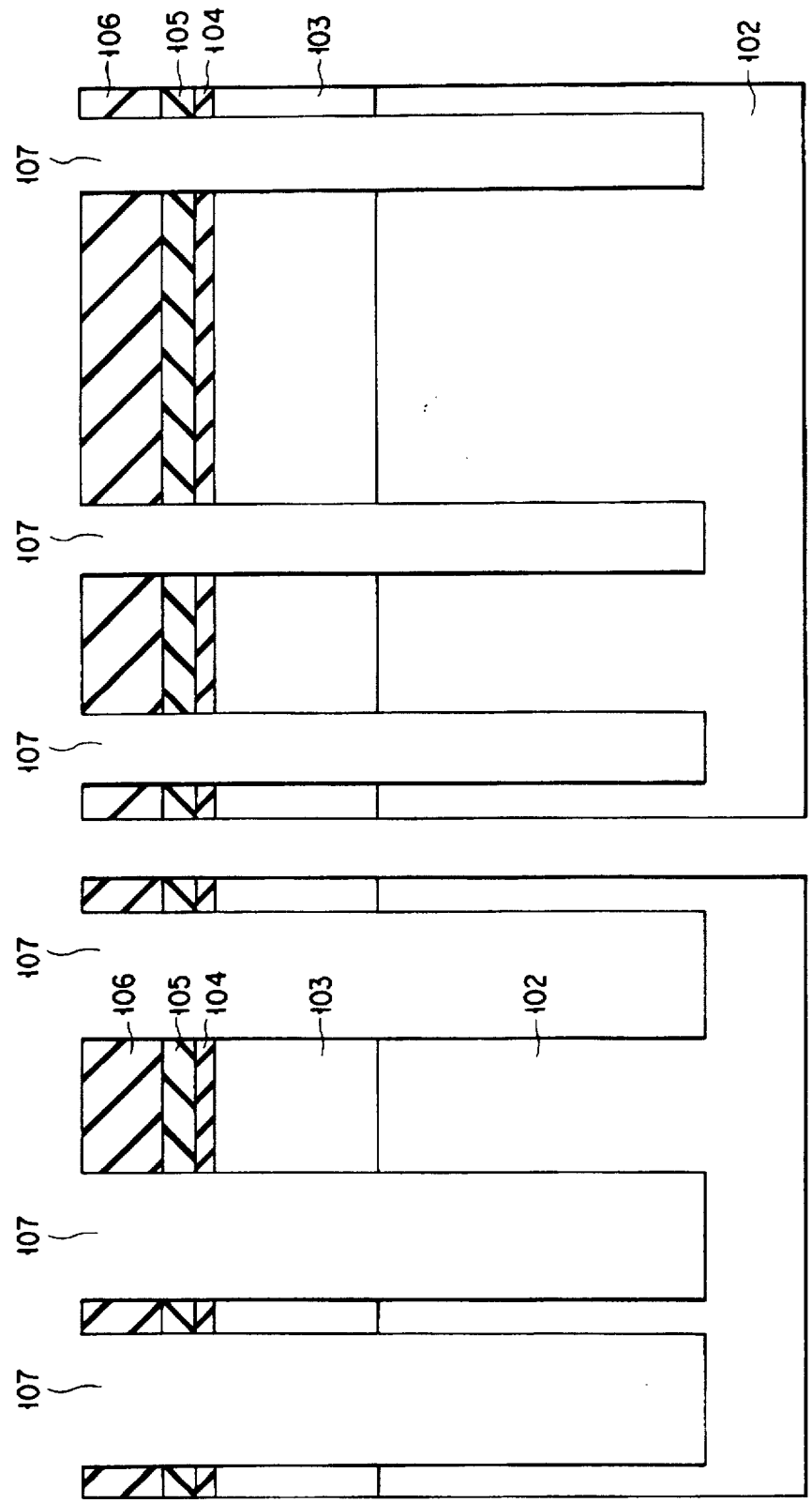

After this, preset regions of the mask films 106, 105, 104 are etched out by use of the normal lithography technology and the anisotropic etching technique such as RIE (Reactive Ion Etching) and the silicon layers 103, 102 are etched with the silicon oxide film 106 (hereinafter called as "oxide film") used as a mask to form the trenches 107 (FIGS. 3A and 3B).

Then, capacitor insulating films 108 formed of an NO film (a silicon nitride film and a silicon oxide film) are deposited in the trenches 107 and polycrystalline silicon is filled into the trenches to a desired depth of the trench to form storage electrodes 109.

Next, portions of the capacitor insulating films 108 which are exposed to the upper portions of the trenches 107 are removed and side wall insulating films 110 of an oxide film are formed on the side wall portions of the openings 107 (FIGS. 4A and 4B).

Further, polycrystalline silicon is filled on the storage electrodes 109 in the trenches 107 to the same height as the oxide film 106 so as to form storage electrodes 109' (FIGS. 5A and 5B).

Figure 6B:
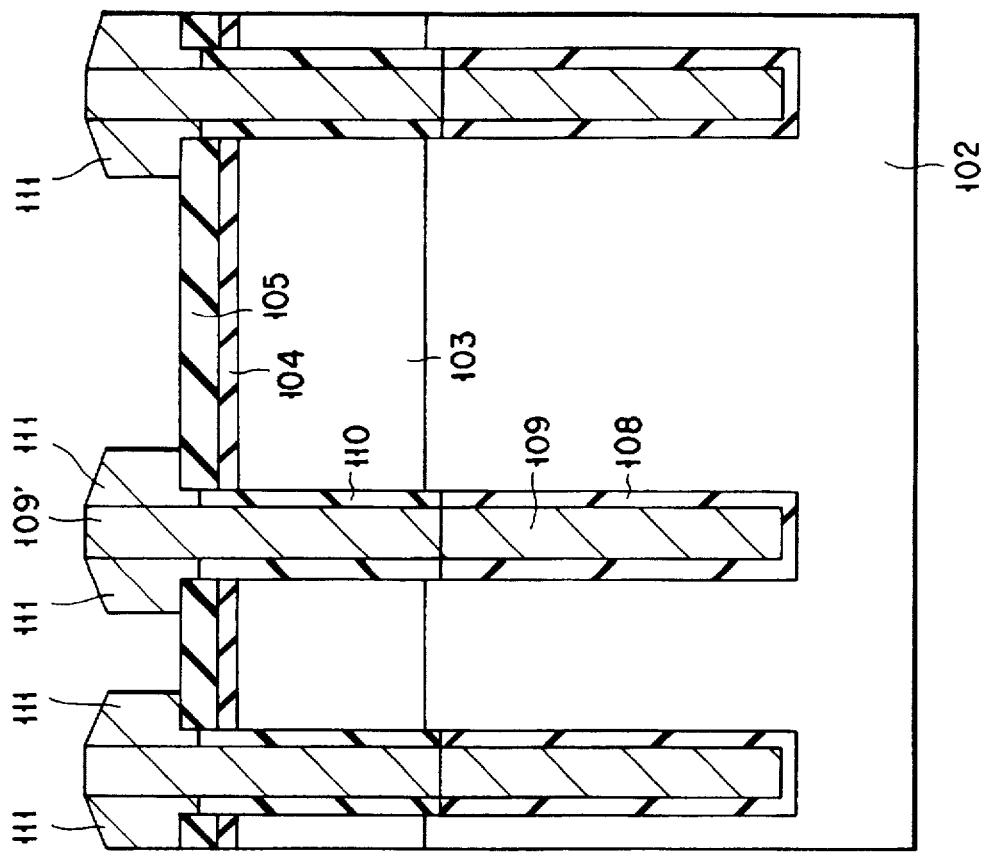
Figure 6A:
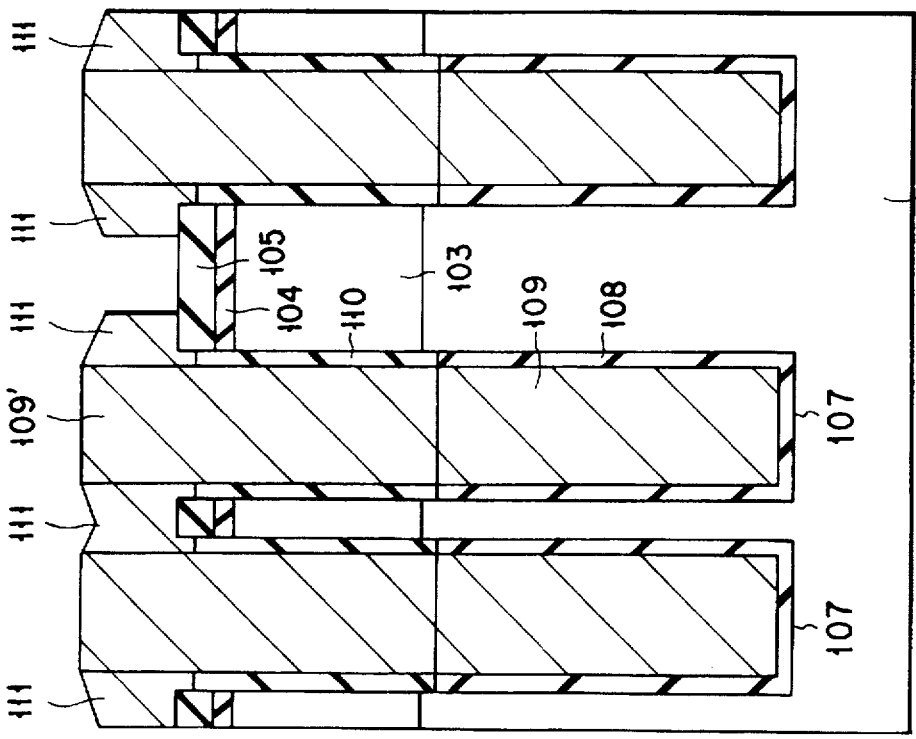

Next, after the oxide films 106 and 110 are removed by RIE or by use of an NH$_4$F solution, mask members 111 of polysilicon films are formed on the side walls of projected portions of the storage electrodes 109' and then portions of the silicon nitride films 105 (hereinafter called as "nitride film") are exposed (FIGS. 6A and 6B). The process for forming the mask members 111 is effected by forming a polysilicon film on the entire surface by the CVD method and selectively leave the polysilicon film on the side walls of the storage electrodes 109' by the anisotropic etching technique.

In order to project the storage electrode 109' and form the mask member 111 on the side wall of the projected portion thereof, it is necessary to fill the storage electrode 109' to a level higher than the under surface of the oxide film 106 in the step of filling the storage electrode 109' in the trench 107.

After this, the exposed nitride films 105 and oxide films 104 are removed by the anisotropic etching such as RIE with the polysilicon films 109' and mask members 111 used as a mask so as to expose corresponding portions of the silicon layers 103 (FIGS. 7A and 7B).

Next, grooves 112 for element isolation are formed in the P-type silicon layer 103 by the anisotropic etching such as RIE by using the nitride films 105 and oxide films 104 left behind under the mask members 111 as a mask.

At this time, if the mask members 111 and storage electrodes 109' are formed of polycrystalline silicon, the mask members 111 and portions of the storage electrodes 109' are etched at the same time as the etching of the silicon layer 103 and grooves 113 are formed on the storage electrodes 109' (FIGS. 8A and 8B). Thus, the feature of this embodiment is that the grooves 112 for element isolation can be formed in self-alignment with the storage electrodes 109'.

After this, insulating films 114 such as oxide films are filled in the grooves 112 for element isolation and the grooves 113 on the storage electrodes 109' by the etchback process using RIE or polishing such as CMP (Chemical-Mechanical Polishing). Further, the nitride films 105 are removed by etching, impurity such as boron is doped into the silicon layer 103 by the ion-implantation technique, for example, and the impurity concentration of regions 115 which will be used as the channel regions of transistors is adjusted (FIGS. 9A and 9B).

Next, the oxide films 104 are removed and then a gate insulation film 116 such as an oxide film (SiO$_2$) is formed on the silicon layer 103 by thermal oxidation or CVD (Chemical Vapor Deposition) method, for example (FIGS. 10A and 10B).

After this, a gate electrode film 117 such as a polysilicon film is formed on the gate insulating film and an insulating film 118 such as a nitride film is formed thereon (FIGS. 11A and 11B).

Next, the nitride film 118 and polysilicon film 117 are processed by use of the conventional lithography technology and the anisotropic etching technique such as the RIE to form gate electrodes (FIGS. 12A and 12B).

Figures 13A, 13B:
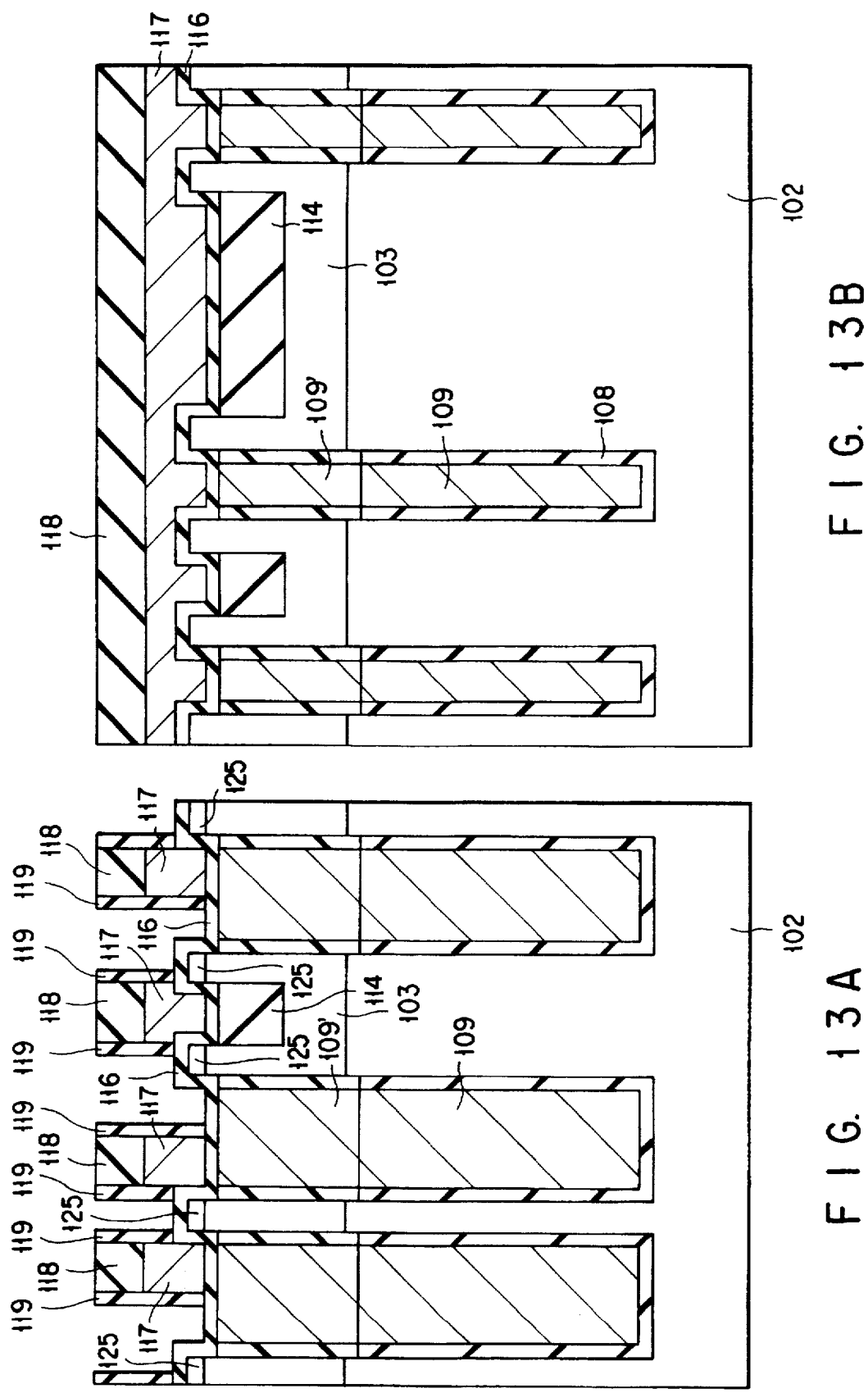

In this case, if necessary, impurity such as arsenic is doped into the silicon layer 103 by the ion-implantation technique, for example, so as to form source or drain diffusion layers 125 of transistors (FIGS. 13A and 13B).

Further, side wall insulating films 119 of nitride films or the like are formed on the side walls of the gate electrodes 117. The source or drain diffusion layers 125 may be formed at this stage by ion-implanting impurity such as arsenic.

After this, portions of the oxide films 116 lying on the storage electrodes 109' and silicon layer 103 are removed by etching such as the RIE with the side wall insulating films 119 as a mask so as to expose the surfaces of the diffusion layers 125 and portions of the storage electrodes 109'.

Figures 14A, 14B:
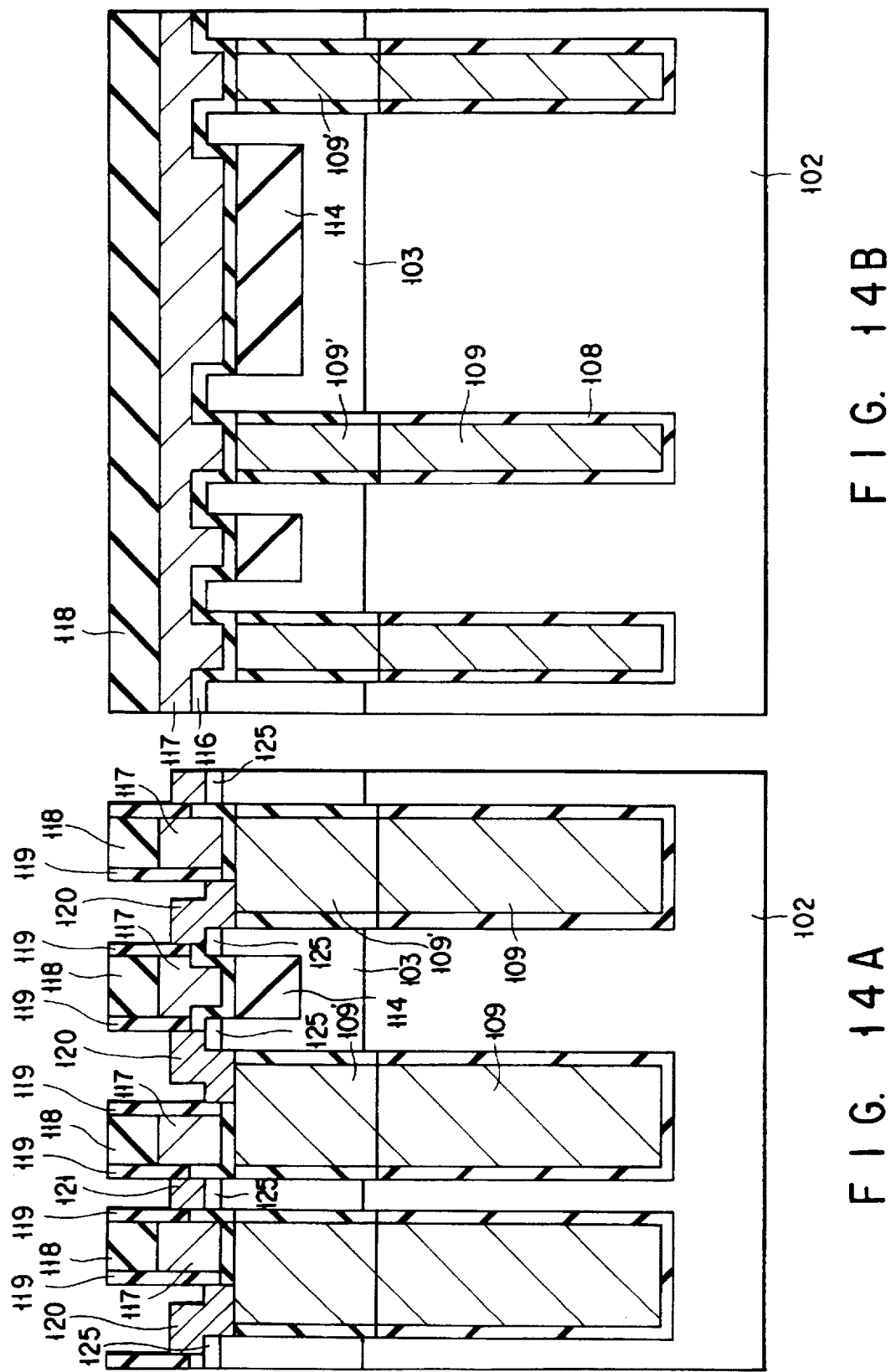

Then, for example, tungsten is grown on the exposed portions of the storage electrodes 109' and the silicon layer 103 by use of the selective deposition process for tungsten so as to form connection electrodes 120 for connecting the storage electrodes 109' to the respective diffusion layers 125 and buried electrodes 121 partly filling bit line connection holes (FIGS. 14A and 14B).

Figures 15A, 15B:
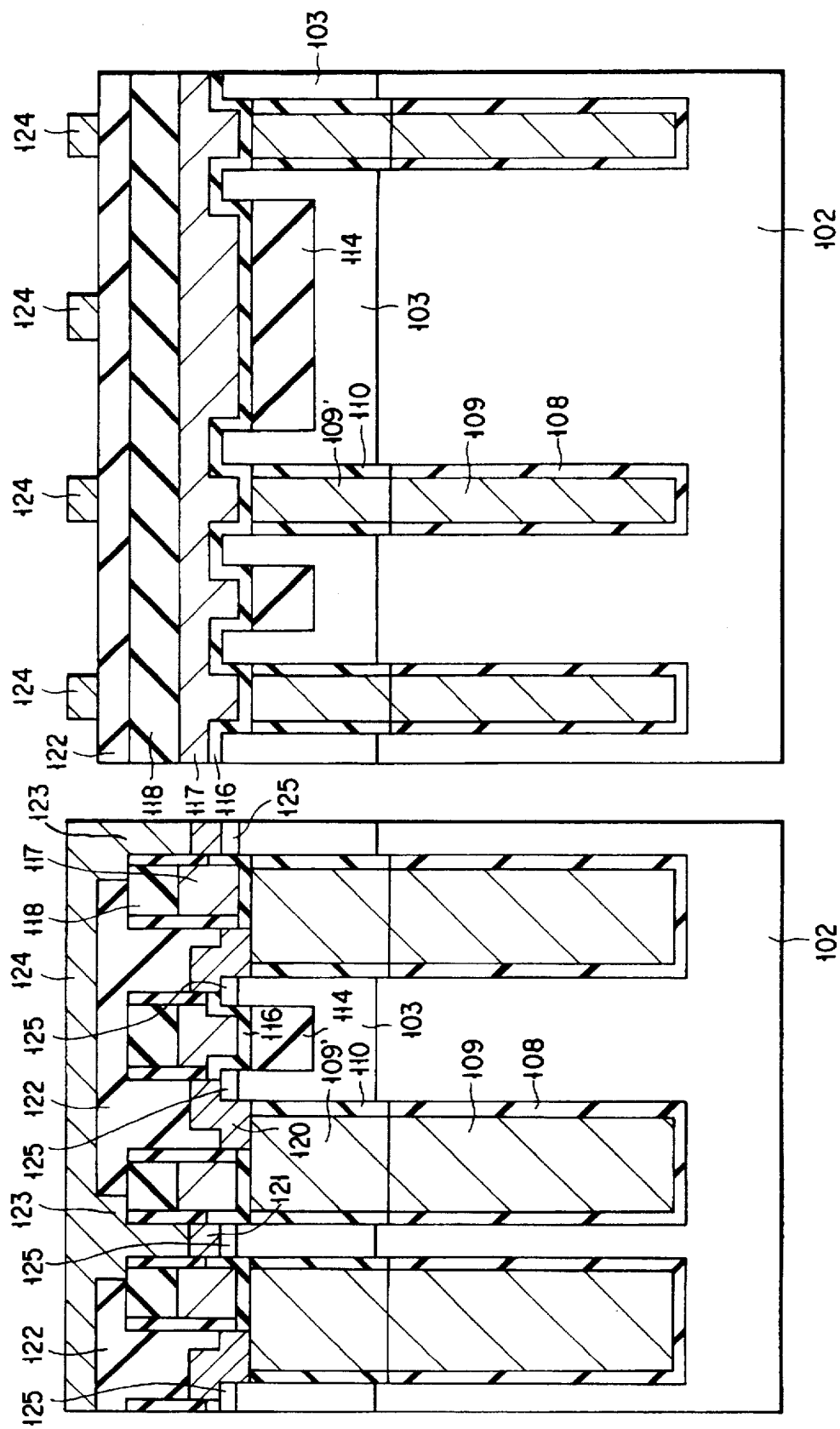

Next, an inter-level insulating film 122 is formed then bit line connection holes 123 are formed to expose the surfaces of the buried electrodes 121. A bit line electrode material such as tungsten is deposited to be connected to the buried electrodes 121 and then bit lines 124 are formed by use of the conventional lithography technology and the anisotropic etching technique such as the RIE (FIGS. 15A and 15B).

After this, an inter-level insulating film, wirings and the like are formed by use of a known conventional process used for forming an integrated circuit to complete the DRAM.

Thus, according to this embodiment, the element isolation regions 114 can be formed in self-alignment with the trenches 107 by forming the element isolation regions 114 in the silicon layer 103 by forming the storage electrodes 109' to project from the surface of the silicon layer 103 and using the mask members 111 formed on the side walls of projected portions of the storage electrodes as a mask.

Further, the area for the diffusion layer 125 can always be stably obtained by forming the diffusion layer 125 by use of the semiconductor substrate surface exposed by removing the mask members as the element region. Therefore, a sufficiently large contact area can be obtained between the diffusion layer 125 and the connection electrode 120 formed on the diffusion layer 125 and storage electrode 109', and the contact resistance therebetween can be reduced. Since the connection resistance between the storage electrode 109' and the diffusion layer 125 can thus be stably reduced, the stable operation of the DRAM can be ensured.

The manufacturing method of this embodiment can be applied to an SOI (Silicon On Insulator) substrate. FIGS. 16A, 16B to 18A, 18B show the example thereof.

FIGS. 16A and 16B are cross sectional views corresponding to FIGS. 3A and 3B. FIGS. 16A and 16B are similar to FIGS. 3A and 3B except that a silicon layer 103' is formed over a silicon substrate 102' with an insulating layer 100 disposed therebetween. The process is effected in the same manner as illustrated with reference to FIGS. 4A, 4B to 7A, 7B.

FIGS. 17A and 17B are cross sectional views corresponding to FIGS. 8A and 8B. FIGS. 17A and 17B are similar to FIGS. 8A and 8B except that openings 112 formed in the silicon layer 103' are formed to reach the insulating layer 100. After this, the process is effected in the same manner as illustrated with reference to FIGS. 9A, 9B to 14A, 14B.

FIGS. 18A and 18B are cross sectional views corresponding to FIGS. 15A and 15B. FIGS. 18A and 18B are similar to FIGS. 15A and 15B except that the element isolation films 114 are formed in contact with the insulating layer 100.

With the above structure, the same effect as that of the first embodiment can be obtained.
(Second Embodiment)

Next, as the second embodiment of this invention, a method for manufacturing a DRAM for preventing a reduction in the film thickness of the oxide film on the storage electrode 109' and preventing occurrence of the short circuit between the storage electrode 109' and the gate electrode 117 is explained. FIGS. 19A, 19B to 25A, 25B are cross sectional views for illustrating the steps of a method for manufacturing a DRAM according to the second embodiment of this invention. In the second embodiment, portions which are the same as those used in the first embodiment are denoted by the same reference numerals.

The process up to the step of forming the grooves 112 for element isolation in the silicon layer (P-type well) 103 is effected in the same manner as in the manufacturing process in the first embodiment (FIGS. 3A, 3B to 8A, 8B).

Figure 19B:
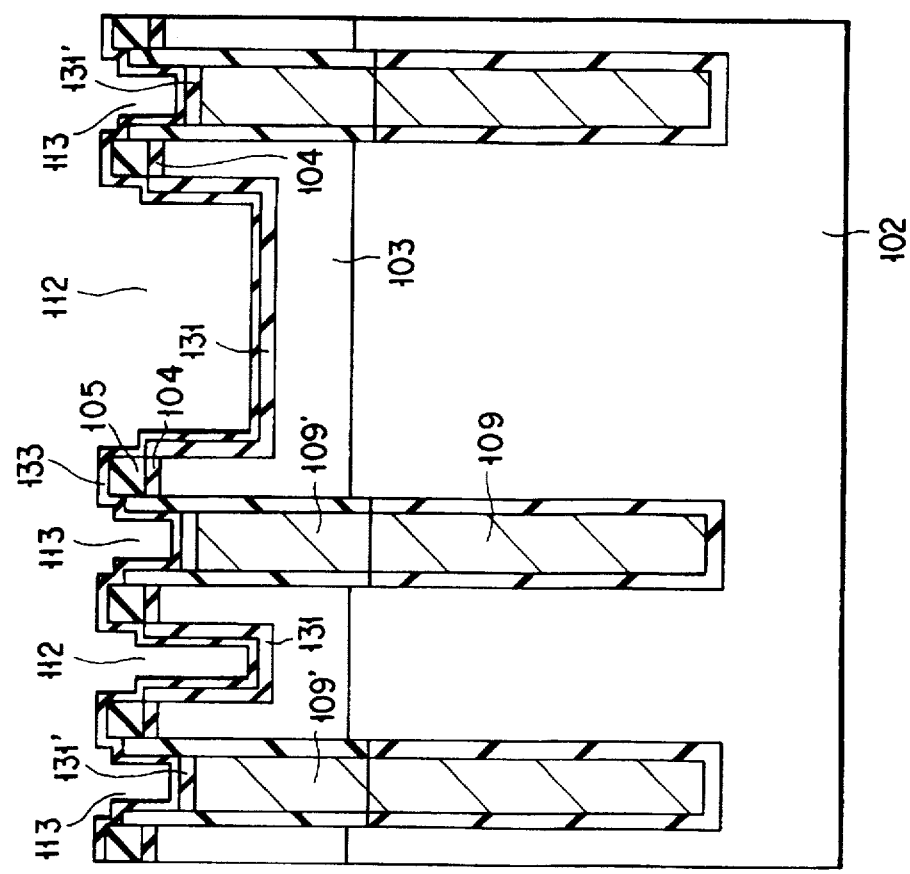
Figure 19A:
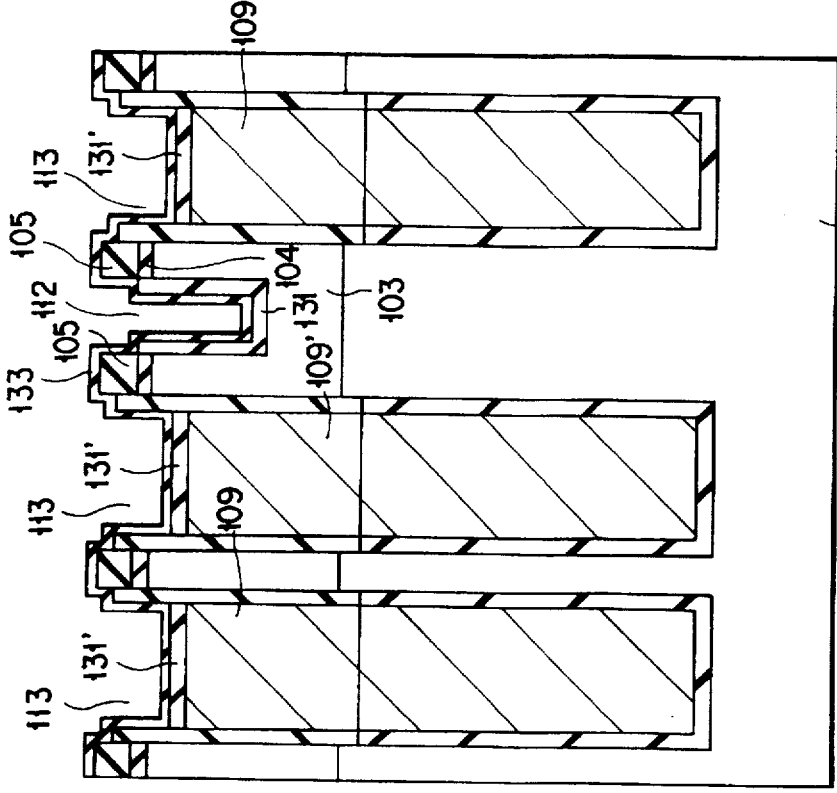

After this, as shown in FIGS. 19A and 19B, oxide films 131 on the inner walls of the grooves 112 and oxide films 131' on the storage electrodes 109' are formed by the thermal oxidation or CVD method. Further, protection films 133 such as nitride films are formed on the oxide films 131 and 131'. The protection films 133 are used to protect the oxide films 131' on the storage electrodes 109' when the oxide films 104 on the silicon layer 103 are removed, and a material having a low etching rate for the process for removing the oxide films 104 is selected. For example, when the oxide films 104 are removed by use of $NH_4F$ as in this embodiment, a nitride film can be used as the protection film 133.

Next, insulating films 134 such as oxide films are deposited and the insulating films 134 are filled in the grooves 112 and 113 by the CMP method or etchback method (FIGS. 20A and 20B).

Figure 21B:
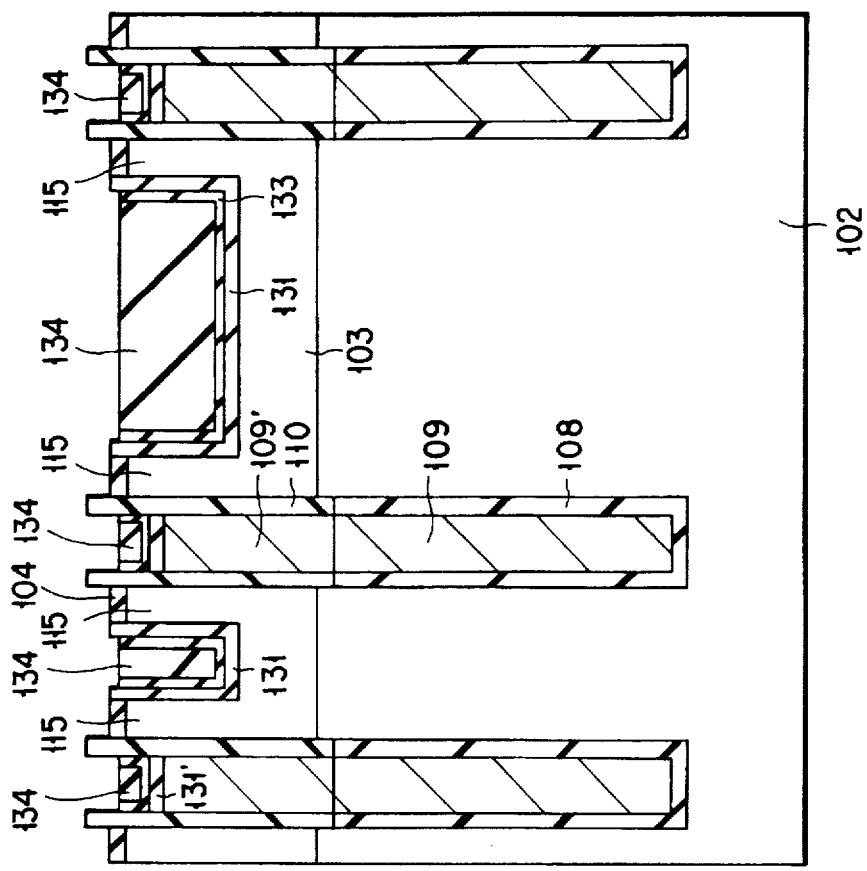
Figure 21A:
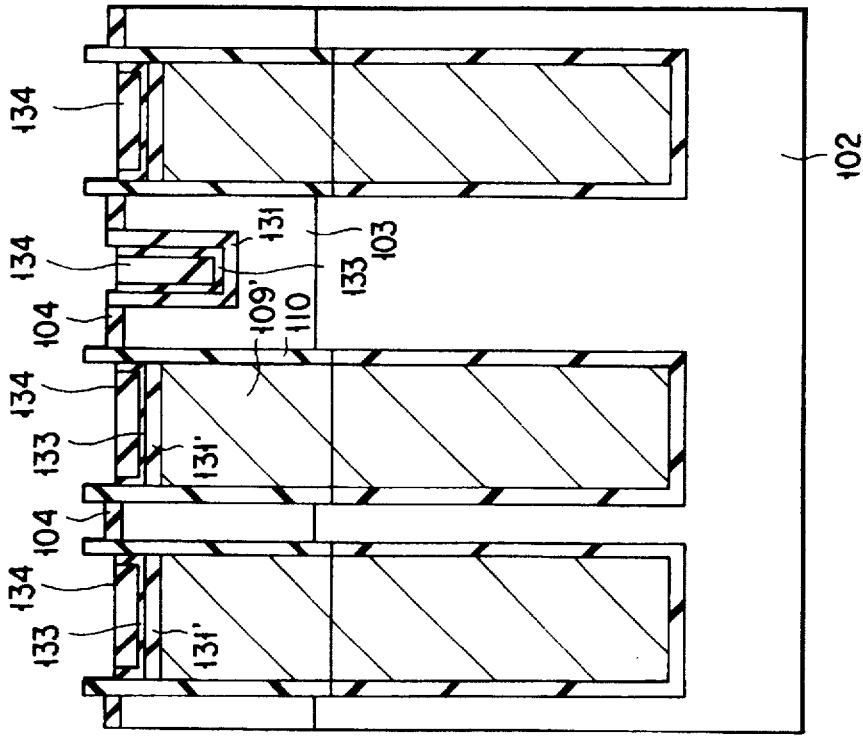

Further, the insulating films 134 are etched to a desired film thickness by the etchback method, for example. Then, exposed portions of the nitride films 105 and 133 are removed by the CDE (Chemical Dry Etching), impurity such as boron is doped into the silicon layer 103 by the ion-implantation technique and the impurity concentration of the channel regions 115 of transistors is adjusted (FIGS. 21A and 21B).

Figure 22A:
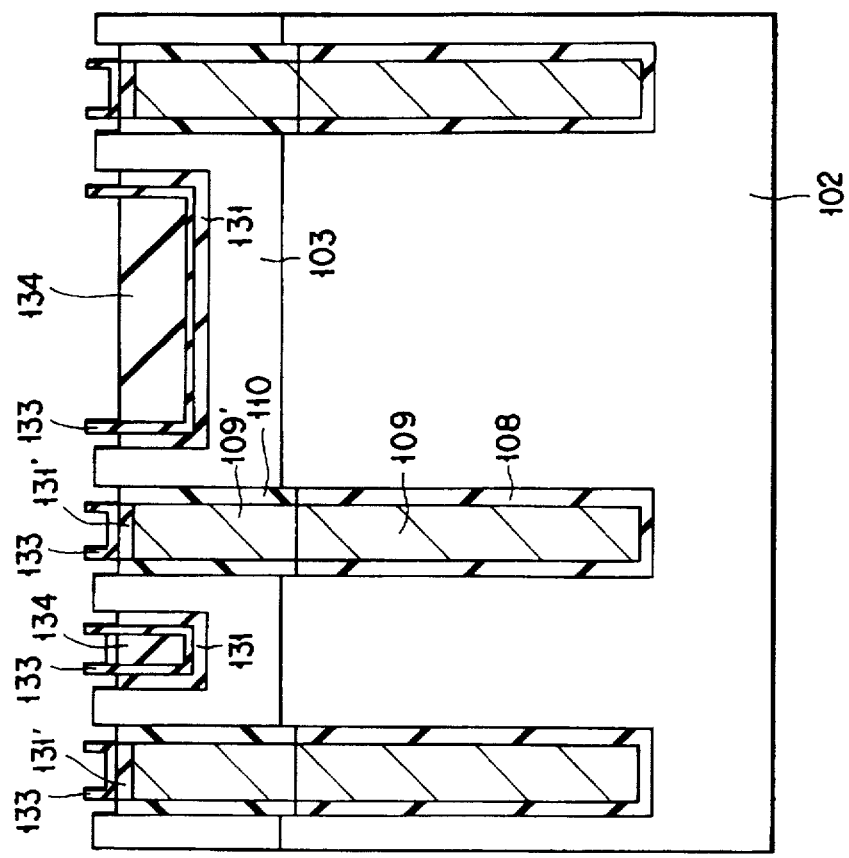
Figure 22B:
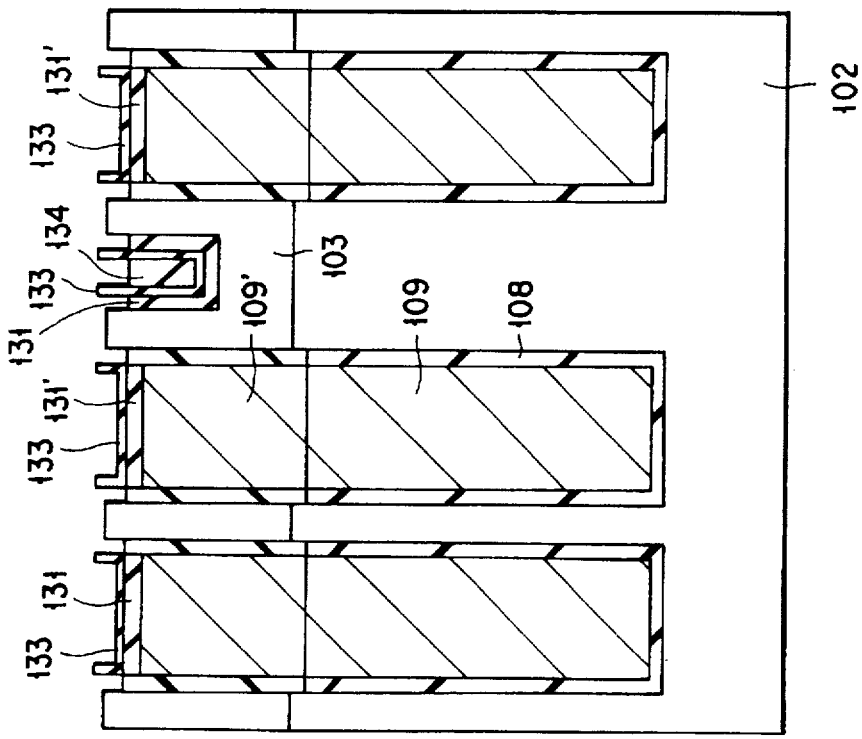

After this, the oxide films 104 on the silicon layer 103 are removed by use of $NH_4F$. At this time, as described before, the oxide films 131' on the storage electrodes 109' are protected from the $NH_4F$ etching by the nitride films 133 and left behind (FIGS. 22A and 22B).

Further, a gate insulating film 116 is formed by the thermal oxidation or the like and then, like the case of the first embodiment of this invention, gate electrodes 117 are formed (FIGS. 23A and 23B) and inter-level insulating films 118 and bit lines 124 are formed to complete a DRAM (FIGS. 24A and 24B).

Thus, in addition to the feature of the first embodiment, this embodiment has a feature that the oxide films 131' are prevented from being etched in the step of forming the oxide films 131' and the protection films 133 on the storage electrodes 109' after the grooves 112 for element isolation are formed and exposing the silicon layer 103 before the gate insulating films 116 are formed. Thus, in this embodiment, since the oxide films 131' which are thick in comparison with the case of the first embodiment can be left behind between the storage electrodes 109' and the gate electrodes 117, the short circuit between the storage electrode 109' and the gate electrode 117 can be more reliably prevented.
(Third Embodiment)

Next, as the third embodiment of this invention, a method for manufacturing a DRAM for preventing occurrence of the short circuit between the bit line and the storage electrode is explained. FIGS. 25 to 31 are enlarged views corresponding to the cross sectional views taken along the line 3A—3A of FIG. 2A, for illustrating the steps of a method for manufacturing a DRAM according to the third embodiment of this invention.

Figure 25:
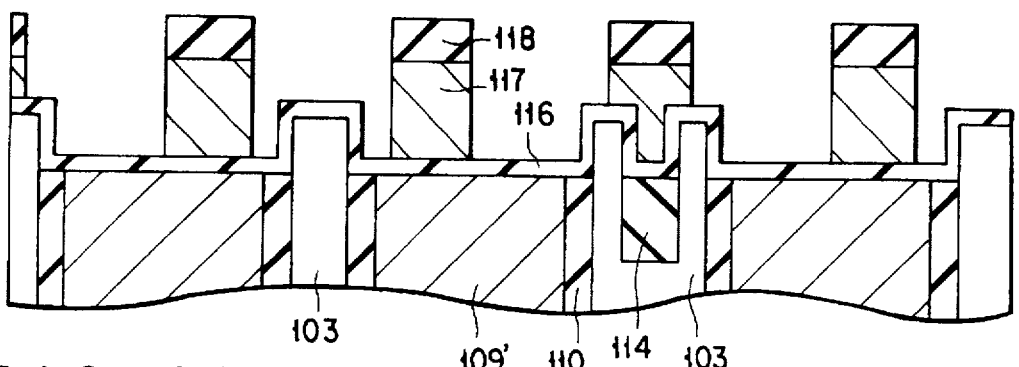

The process up to the step of forming the gate electrodes is effected in the same manner as in the first embodiment of this invention. FIG. 25 is an enlarged view of the cross sectional view of FIG. 12A. For the process up to the present step, the manufacturing method of the second embodiment may be used. Further, at this stage, impurity such as arsenic may be doped into the silicon layer 103 by the ion-implantation technique, for example, to form source or drain diffusion layers 125 of the transistors, if required.

Figure 26:
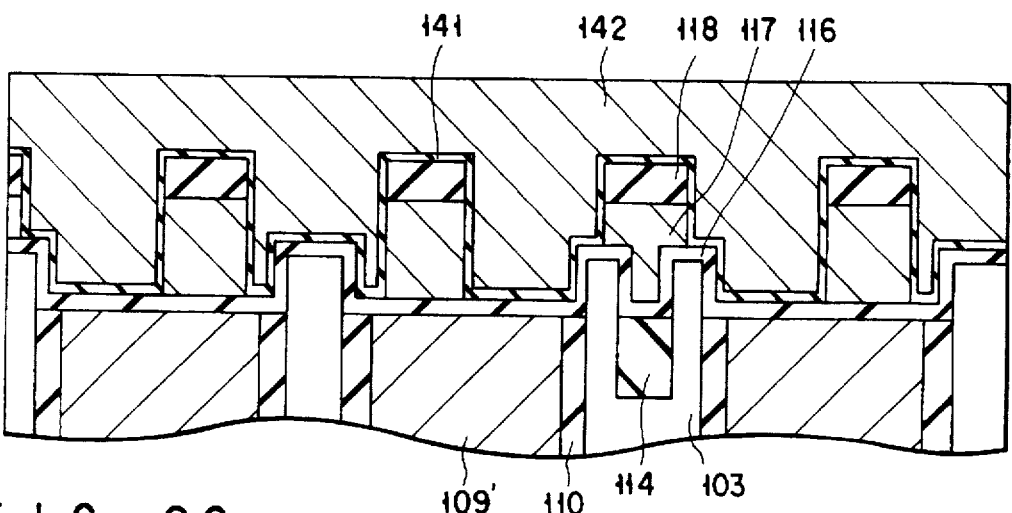

After this, nitride films 141 and a polysilicon film 142 are deposited in this order by the CVD method (FIG. 26).

Figure 27:
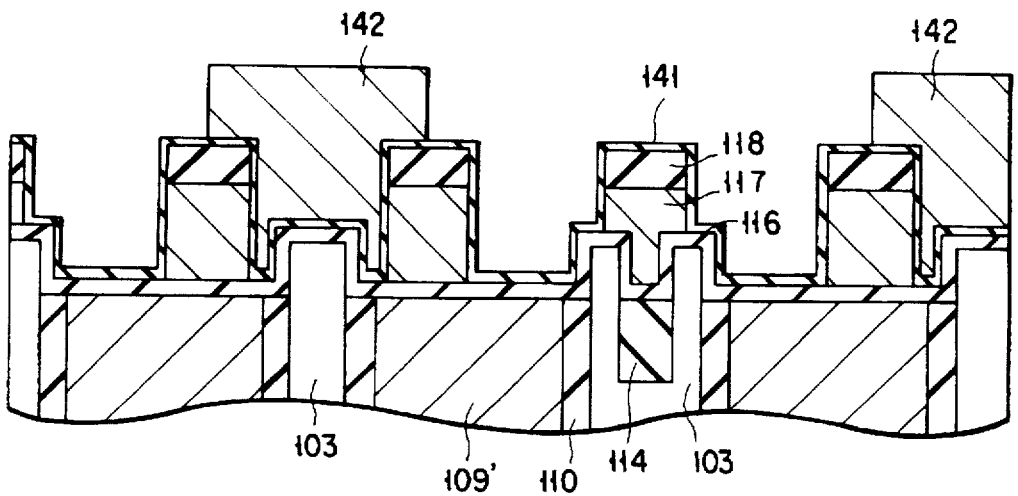

Next, a resist film for covering portions corresponding to bit line connection holes is formed by use of the normal lithography technology and the polysilicon film 142 is etched by the anisotropic etching technique such as RIE, for example, with the resist film used as a mask so as to expose the nitride films 141 (FIG. 27).

Figure 28:
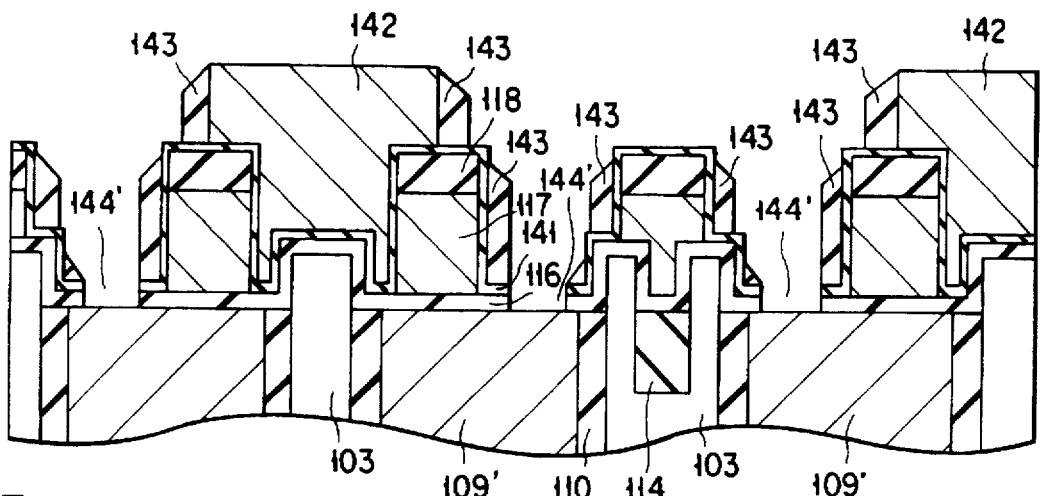

After this, side wall insulating films 143 formed of silicon nitride films are formed on the side walls of the polysilicon films 142 and the gate electrode structures 117, 118 and the oxide films 116 are exposed. At this stage, the source or drain diffusion layers 125 may be formed by ion-implanting arsenic or the like. Further, the oxide films 116 are removed by using the side wall insulating films 143 and the polysilicon films 142 as a mask to expose the silicon layer 103 and the storage electrodes 109' so as to form storage electrode connection holes 144' (FIG. 28).

Figure 29:
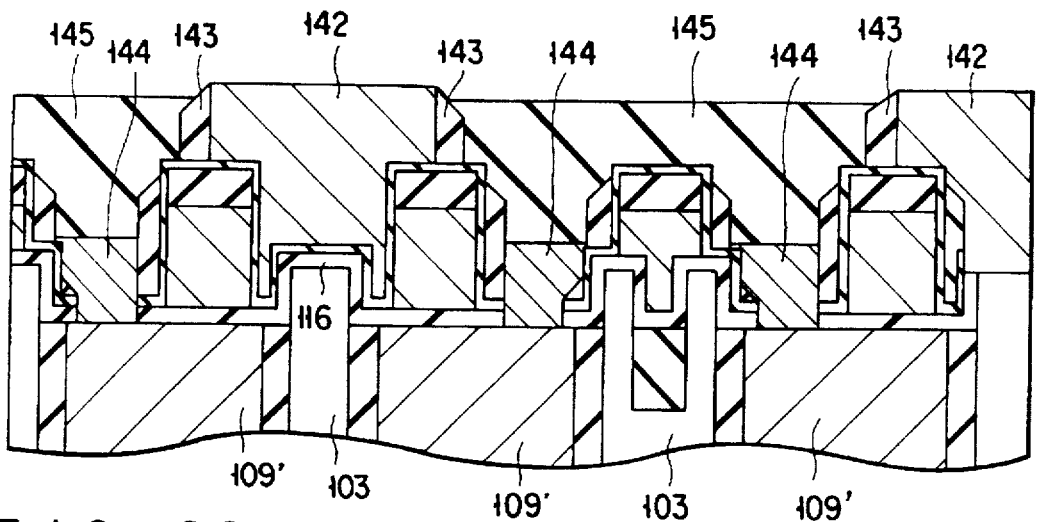

Then, tungsten is grown on the exposed portions of the storage electrodes 109' and the silicon layer 103 by use of the selective deposition process for tungsten so as to form connection electrodes 144 for connecting the storage electrodes 109' to the silicon layer 103. Further, an inter-level insulating film 145 such as an oxide film is deposited and then the surfaces of the polysilicon films 142 are exposed by etching the inter-level insulating film 145 by the CMP method, etchback method or the like. As a result, the inter-level insulating films 145 are filled on the connection electrodes 144 (FIG. 29).

Figure 30:
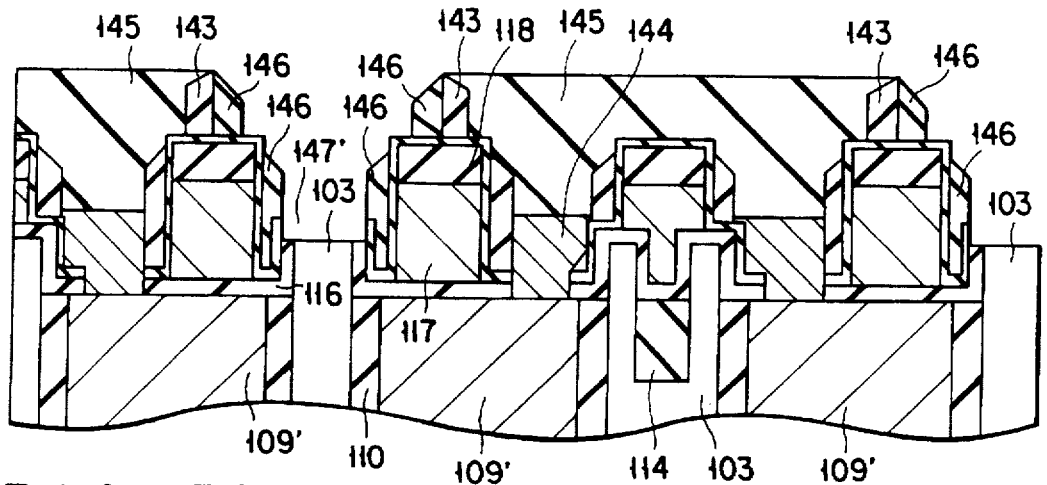

Next, the polysilicon films 142 are removed by CDE. After this, side wall insulating films 16 of nitride films are formed on the side wall portions of the gate electrode structures 117, 118 and the side wall insulating films 143, and then the gate insulating films 116 are exposed. Further, the exposed gate insulating films 116 are removed by the etching using $NH_4F$ or RIE. As a result, the silicon layer 103 is partly exposed to form bit line connection holes 147' (FIG. 30).

Figure 31:
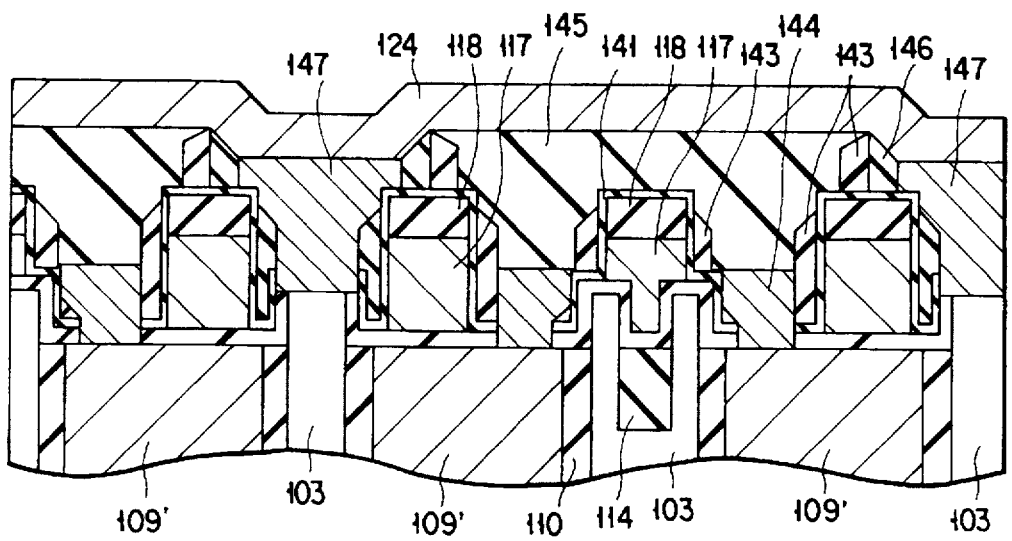

After this, polysilicon films are formed on portions of the polysilicon layer 103 exposed to the bit line connection holes 147' by the burying technique using CMP or the selective deposition method so as to form bit line buried electrodes 147. Further, a bit line electrode material such as tungsten is deposited and bit lines 124 are formed by use of the normal lithography technology and the anisotropic etching technique such as RIE (FIG. 31).

Thus, according to this embodiment, in the process of forming the storage electrode connection holes 144', storage electrode connection electrodes 144, bit line connection holes 147' and bit line buried electrodes 147, the lithography process (the patterning of the polysilicon films 142) is effected only once. Therefore, in this embodiment, in comparison with the first embodiment in which the patterning of the bit line connection holes 147 is effected again by effecting the lithography process after the storage electrode connection electrodes 144 are formed, the short circuit between the storage electrode connection electrode 144 and the bit line 124 can be more reliably prevented without being influenced by the accuracy of alignment between the patternings.

(Fourth Embodiment)

Next, as the fourth embodiment, a case wherein this invention is applied to a memory cell having an area of $8 \times F^2$ when the minimum processing size is set to F is explained.

FIGS. 32A and 32B are plan views showing the layout pattern of the memory cell having an area of $8 \times F^2$. FIG. 32A shows the ½-pitch layout in which the same pattern is repeated for every two bit lines and FIG. 32B shows the ¼-pitch layout in which the same pattern is repeated for every four bit lines.

FIG. 33A is a cross sectional view taken along the line 33A—33A of FIG. 32A and FIG. 33B is a cross sectional view taken along the line 33B—33B of FIG. 32A. Also, in the layout shown in FIG. 32B, the cross sections taken along the cut lines are substantially the same as those for FIG. 32A and can be shown by FIGS. 33A and 33B. FIGS. 33A and 33B show a stage corresponding to the stage indicated by FIGS. 15A and 15B of the first embodiment and portions which are the same as those in FIGS. 15A and 15B are denoted by the same reference numerals.

Like the first embodiment, as shown in FIGS. 32A and 32B, gate electrodes 117 and trenches 107 in which storage electrodes are filled are formed one on each side of a bit line connection hole 123 connected to a bit line 124, and the two trenches for each bit line connection hole make a pair and an element isolation groove 112 is formed around the pair of trenches.

Like the first embodiment, the element isolation groove 112 is formed in self-alignment with the trench 107 for storage electrode. That is, in a region in which the distance between the trenches 107 for storage electrodes is long, the element isolation groove 112 is formed, and in a region (bit line contact region) in which the distance between the trenches 107 for storage electrodes is short, the element isolation groove 112 is not formed.

The memory cell of this embodiment can be formed by the same manufacturing method used in the first embodiment.

Thus, this invention can be applied to the memory cell having any cell area by adequately setting the distance between the trenches 107 for storage electrodes.

In the memory cell structure of this invention, in a case where the distance between the two trenches 107 in the region in which the bit line connection holes 123 are formed is larger than twice the film thickness of the side wall mask member 111 (shown in FIG. 6A), the trench element isolation portion is formed in that region. In such a case, an element isolation insulating film is formed, for example, in a center portion of the diffusion layer 125 and P well 103 between the two trenches 107 in the righthand side of FIG. 33. However, the bit line 124 can be connected to the diffusion layers 125 formed on the opposing peripheral portions of the trenches via the buried electrode 121, so that no connection problem occurs.

Nonetheless, from a view point of packing density, it is preferable that such an element isolation insulating film is not formed. Therefore, in the region in which the bit line connection hole 123 is formed, it is necessary to make the distance between the two trenches 107 smaller than twice the film thickness of the side wall mask member 111 and, for example, the distance is set to be smaller than the minimum processing size in some cases.

A method for forming the patterns of the trenches with a distance therebetween smaller than the minimum processing size by use of the lithography technology is explained with reference to FIGS. 34A to 34C. The drawings show patterns of a mask used for the lithography technology when the trench (opening) is formed.

As shown in FIG. 34A, the first method is a method for forming the opposed portions of patterns 151 of the adjacent openings to project towards each other in the bit line connection formation region of the mask pattern. If the normal exposure process using the mask having the patterns 151 is effected, the exposure amount in a portion in which the pattern width is small is not sufficiently large and no opening is formed in the resist film in this portion, thereby making it possible to make the distance between the two openings smaller than the minimum processing size.

As shown in FIG. 34B, the second method is a method for using patterns 151 and 150 of two openings formed with a distance therebetween smaller than the minimum processing size as one pair and forming a phase shifter in the pattern 150 which is one of the pair of patterns of the openings. The phase shifter is formed of a thin film which causes the phase of light passing the pattern 150 having the phase shifter to have an inverted relation with respect to the phase of light passing the other pattern 151. By setting the inverted relation between the phases of the two lights close to each other, a degradation in the resolution caused by the coherence between the two lights can be suppressed and a resist film having patterns with a distance smaller than the minimum processing size can be easily formed.

As shown in FIG. 34C, the third method is a method for extending the opposed portions of the patterns 151 and 150 of two adjacent openings so as to be made in contact with each other and forming a phase shifter in the pattern 150 to set one end of the phase shifter at the center between the original regions of the two openings. Also, in this method, like the second method, a degradation in the resolution caused by the coherence between the two lights can be suppressed and a resist film having patterns with a distance therebetween smaller than the minimum processing size can be easily formed.

By using the above-described mask, since openings with a distance smaller than the minimum processing size can be formed, it becomes possible to prevent a trench element isolation portion from being formed in this region and enhance the good connection between the transistor and the bit line via the bit line connection hole.

As described above, according to the semiconductor memory device and the method for manufacturing the same in this invention, a desired area for the diffusion region of the transistor can be stably obtained, the connection resistance between the storage electrode and the diffusion region of the transistor can be reduced and the stable operation can be attained without being influenced by the accuracy of alignment of the patternings between the element region and the trench (opening) in which the storage electrode is filled.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A method for manufacturing a semiconductor memory device comprising the steps of:

forming a plurality of openings in a laminated insulating layer formed of at least two layers laminated on a semiconductor substrate;

forming a plurality of trenches in said semiconductor substrate by using said laminated insulating layer having said plurality of openings as a mask;

filling a plurality of storage electrodes into said plurality of trenches to a level which is at least higher than an under surface of an uppermost layer of said laminated insulating layer with capacitor insulating films disposed therebetween, respectively;

removing said uppermost layer of said laminated insulating layer;

forming first mask members on side walls of said plurality of storage electrodes which project as a result of removal of said uppermost layer, respectively;

selectively etching remaining portions of said laminated insulating layer with said first mask members used as masks to expose parts of said semiconductor substrate;

etching said exposed parts of said semiconductor substrate to form a plurality of grooves; and filling first insulating films at least in said plurality of grooves to form an element isolation region.

2. A method for manufacturing a semiconductor memory according to claim 1, further comprising the steps of:

removing said first mask members to expose laminated insulating layer left behind under said first mask members;

removing said exposed laminated insulating layer to form partly exposed regions of said semiconductor substrate;

forming gate insulating films on said partly exposed regions of said semiconductor substrate;

forming a plurality of gate electrodes, each having a second insulating film thereon, on said gate insulating films, respectively;

exposing parts of surfaces of said plurality of storage electrodes and first parts of a surface of said semiconductor substrate respectively adjacent to said plurality of storage electrodes;

forming conductive layers extending from said exposed parts of said surfaces of said plurality of storage electrodes over to said first parts of said surface of said semiconductor substrate to connect said plurality of storage electrodes to said first parts of said surface of said semiconductor substrate, respectively;

forming an inter-layer insulating film on said semiconductor substrate;

selectively etching said inter-layer insulating film to expose second parts of said semiconductor substrate and form a plurality of bit line contact holes; and forming a plurality of bit lines formed on said inter-layer insulating film and connected to said second parts of said semiconductor substrate via said bit line contact holes.

3. A method for manufacturing a semiconductor memory according to claim 2, further comprising a step of forming a third insulating film and a protection film at least on said plurality of storage electrodes after said step of removing said first mask members, wherein said protection film is formed of a material which can be left behind even after an etching process is effected in said step of partly exposing said semiconductor substrate by removing said laminated insulating layer.

4. A method for manufacturing a semiconductor memory according to claim 2, further comprising a step of forming gate side wall insulating films at least on side surfaces of said plurality of gate electrodes, respectively, after said step of forming said plurality of gate electrodes.

5. A method for manufacturing a semiconductor memory according to claim 1, further comprising the steps of:

removing said first mask members to expose said laminated insulating layer left behind under said first mask members;

removing said exposed laminated insulating layer to partly expose said semiconductor substrate;

forming gate insulating films on said partly exposed regions of said semiconductor substrate;

selectively forming a plurality of gate electrodes, each having a second insulating film thereon, on said gate insulating films, respectively;

forming second mask members on regions of said semiconductor substrate in which a plurality of bit line contact holes are to be formed;

etching said gate insulating film with at least said second mask members used as masks to expose first parts of said semiconductor substrate and respective parts of said plurality of storage electrodes;

forming conductive layers extending from said respective parts of said plurality of storage electrodes over to said exposed first parts of said semiconductor substrate adjacent thereto to connect said plurality of storage electrodes to said exposed first parts of said semiconductor substrate;

forming an inter-layer insulating film at least on said conductive layers to expose said second mask members;

removing said exposed second mask members;

removing said gate insulating film lying under said second mask members to expose second parts of said semiconductor substrate; and forming a plurality of bit lines connected to said exposed second parts of said semiconductor substrate on said inter-layer insulating film.

6. A method for manufacturing a semiconductor memory according to claim 5, further comprising a step of forming a fourth insulating film over an entire surface of said semiconductor substrate after said step of selectively forming said plurality of gate electrodes, wherein said step of etching said gate insulating film to expose said first parts of said semiconductor substrate and said respective parts of said storage electrodes and said step of removing said gate insulating film lying under said second mask members to expose said second parts of said semiconductor substrate include a step of etching said fourth insulating film.

7. A method for manufacturing a semiconductor memory according to claim 6, further comprising a step of forming first gate side wall insulating films on side surfaces of said plurality of gate electrodes with said fourth insulating film disposed therebetween except side surfaces thereof covered with said second mask members after said step of forming said second mask members on regions of said semiconductor substrate in which said plurality of bit line contact holes are to be formed.

8. A method for manufacturing a semiconductor memory according to claim 7, further comprising a step of forming second gate side wall insulating films on said side surfaces of said plurality of gate electrodes with said fourth insulating film disposed therebetween after said step of removing said second mask members.

9. A method for manufacturing a semiconductor memory device comprising the steps of:

forming a semiconductor region over a semiconductor substrate with a buried insulating layer disposed therebetween;

forming a plurality of openings in a laminated insulating layer formed of at least two layers laminated on said semiconductor region;

forming a plurality of trenches to penetrate said semiconductor region and said buried insulating layer and reach said semiconductor substrate by using said laminated insulating layer having said plurality of openings as a mask;

filling a plurality of storage electrodes into said plurality of trenches to a level which is at least higher than an under surface of an uppermost layer of said laminated insulating layer with capacitor insulating films disposed therebetween, respectively;

removing said uppermost layer of said laminated insulating layer;

forming first mask members on side walls of said plurality of storage electrodes which project as a result of removal of said uppermost layer, respectively;

selectively etching remaining portions of said laminated insulating layer with said first mask members used as a mask to expose parts of said semiconductor region;

etching said exposed parts of said semiconductor region to form a plurality of grooves; and filling first insulating films at least in said plurality of grooves to form an element isolation region.

10. A method for manufacturing a semiconductor memory according to claim 9, further comprising the steps of:

removing said first mask members to expose said laminated insulating layer left behind under said first mask members;

removing said exposed laminated insulating layer to form partly exposed portions of said semiconductor region;

forming gate insulating films on said partly exposed portions of said semiconductor region;

forming a plurality of gate electrodes, each having a second insulating film thereon, on said gate insulating films, respectively;

exposing parts of surfaces of said plurality of storage electrodes and first parts of said surface of said semiconductor region respectively adjacent to said plurality of storage electrodes;

forming conductive layers extending from said exposed parts of said surfaces of said plurality of storage electrodes over to said first parts of said surface of said semiconductor region to connect said plurality of storage electrodes to said first parts of said surface of said semiconductor region, respectively;

forming an inter-layer insulating film on said semiconductor region;

selectively etching said inter-layer insulating film to expose second parts of said semiconductor region and form a plurality of bit line contact holes; and forming a plurality of bit lines formed on said inter-layer insulating film and connected to said second parts of said semiconductor region via said bit line contact holes.

* * * * *